US009972640B1

(12) United States Patent
Kai et al.

(10) Patent No.: US 9,972,640 B1
(45) Date of Patent: May 15, 2018

(54) THREE-DIMENSIONAL MEMORY DEVICE WITH SELF-ALIGNED DRAIN SIDE SELECT GATE ELECTRODES AND METHOD OF MAKING THEREOF

(71) Applicant: SANDISK TECHNOLOGIES LLC, Plano, TX (US)

(72) Inventors: James Kai, Santa Clara, CA (US); Murshed Chowdhury, Milpitas, CA (US); Jin Liu, Milpitas, CA (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days. days.

(21) Appl. No.: 15/354,067

(22) Filed: Nov. 17, 2016

(51) Int. Cl.
*H01L 27/11582* (2017.01)
*H01L 27/11519* (2017.01)
(Continued)

(52) U.S. Cl.
CPC .... *H01L 27/11582* (2013.01); *H01L 21/0217* (2013.01); *H01L 21/02164* (2013.01);
(Continued)

(58) Field of Classification Search
CPC ......... H01L 21/02494; H01L 21/02587; H01L 21/31144; H01L 21/31116; H01L 21/76805; H01L 21/76877; H01L 21/02164; H01L 21/0217; H01L 21/02178; H01L 21/02181; H01L 21/02183; H01L 21/02186; H01L 21/02189; H01L 21/02192; H01L 29/512; H01L 29/518; H01L 29/41741; H01L 29/7926;
(Continued)

(56) References Cited

U.S. PATENT DOCUMENTS 5,915,167 A  6/1999 Leedy
9,331,094 B2  1/2016 Pachamuthu et al.
(Continued)

OTHER PUBLICATIONS

International Search Report and Written Opinion from the International Searching Authority for International Patent Application No. PCT/US2017/049723, dated Nov. 16, 2017, 18 pages.
(Continued)

*Primary Examiner* — Sophia Nguyen
(74) *Attorney, Agent, or Firm* — The Marbury Law Group PLLC

(57) ABSTRACT

A three-dimensional memory device including self-aligned drain select level electrodes is provided. Memory stack structures extend through an alternating stack of insulating layers and spacer material layers. Each of the memory stack structures includes a memory film and a memory level channel portion. Drain select level channel portions are formed over the memory level channel portions with respective lateral shifts with respect to underlying memory stack structures. The direction of lateral shifts alternates from row to row for each row of drain select level channel portions. Drain select level gate dielectrics and drain select level gate electrodes are formed on the drain select level channel portions. Each drain select level gate electrode controls two rows of drain select level channel portions, and is laterally spaced from neighboring drain select level gate electrodes.

3 Claims, 29 Drawing Sheets

(51) Int. Cl.

| | | |
|---|---|---|
| *H01L 27/11565* | (2017.01) | |
| *H01L 27/11524* | (2017.01) | |
| *H01L 27/1157* | (2017.01) | |
| *H01L 27/11556* | (2017.01) | |
| *H01L 29/423* | (2006.01) | |
| *H01L 21/02* | (2006.01) | |
| *H01L 21/311* | (2006.01) | |
| *H01L 29/417* | (2006.01) | |
| *H01L 29/51* | (2006.01) | |
| *H01L 21/768* | (2006.01) | |

(52) U.S. Cl.
CPC .. *H01L 21/02192* (2013.01); *H01L 21/02494* (2013.01); *H01L 21/02587* (2013.01); *H01L 21/31116* (2013.01); *H01L 21/31144* (2013.01); *H01L 21/76805* (2013.01); *H01L 21/76877* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 29/41741* (2013.01); *H01L 29/4234* (2013.01); *H01L 29/42324* (2013.01); *H01L 29/512* (2013.01); *H01L 29/518* (2013.01); *H01L 21/02178* (2013.01); *H01L 21/02181* (2013.01); *H01L 21/02183* (2013.01); *H01L 21/02186* (2013.01); *H01L 21/02189* (2013.01)

(58) Field of Classification Search
CPC .......... H01L 29/7923; H01L 27/11582; H01L 27/11524; H01L 27/11519; H01L 27/11556; H01L 27/11565; H01L 27/1157
See application file for complete search history.

(56) References Cited

U.S. PATENT DOCUMENTS

| | | | |
|---|---|---|---|
| 9,368,509 B2 | 6/2016 | Pang et al. | |
| 2010/0176440 A1 | 7/2010 | Omura | |
| 2011/0059595 A1 | 3/2011 | Jung | |
| 2013/0089974 A1* | 4/2013 | Lee | H01L 27/11556 438/510 |
| 2013/0248974 A1* | 9/2013 | Alsmeier | G11C 16/04 257/321 |
| 2015/0294978 A1* | 10/2015 | Lu | H01L 27/1157 438/269 |
| 2016/0111437 A1* | 4/2016 | Pang | H01L 27/11556 257/324 |
| 2016/0204122 A1 | 7/2016 | Shoji et al. | |
| 2016/0322379 A1* | 11/2016 | Oomori | H01L 27/11582 |
| 2016/0322381 A1* | 11/2016 | Liu | H01L 27/11573 |
| 2016/0351497 A1* | 12/2016 | Peri | H01L 23/5226 |
| 2017/0148811 A1* | 5/2017 | Zhang | H01L 27/11582 |
| 2017/0179144 A1* | 6/2017 | Han | H01L 21/76877 |
| 2017/0179154 A1* | 6/2017 | Furihata | H01L 27/11524 |
| 2017/0200733 A1* | 7/2017 | Lee | H01L 21/76816 |
| 2017/0278859 A1* | 9/2017 | Sharangpani | H01L 27/11573 |
| 2017/0287926 A1* | 10/2017 | Ariyoshi | H01L 27/11582 |
| 2017/0358594 A1* | 12/2017 | Lu | H01L 27/11582 |

OTHER PUBLICATIONS

Endoh et al., "Novel Ultra High Density Memory with a Stacked-Surrounding Gate Transistor (S-SGT) Structured Cell," IEDM Proc., (2001), 33-36.
U.S. Appl. No. 15/056,510, filed Feb. 29, 2016, SanDisk Technologies Inc.
U.S. Appl. No. 15/078,555, filed Mar. 23, 2016, SanDisk Technologies LLC.
U.S. Appl. No. 15/219,652, filed Jul. 26, 2016, SanDisk Technologies LLC.
U.S. Appl. No. 15/219,719, filed Jul. 26, 2016, SanDisk Technologies LLC.
U.S. Appl. No. 15/225,492, filed Aug. 1, 2016, SanDisk Technologies LLC.
U.S. Appl. No. 15/286,063, filed Oct. 5, 2016, SanDisk Technologies LLC.
U.S. Appl. No. 15/354,795, filed Nov. 17, 2016, SanDisk Technologies LLC.

* cited by examiner

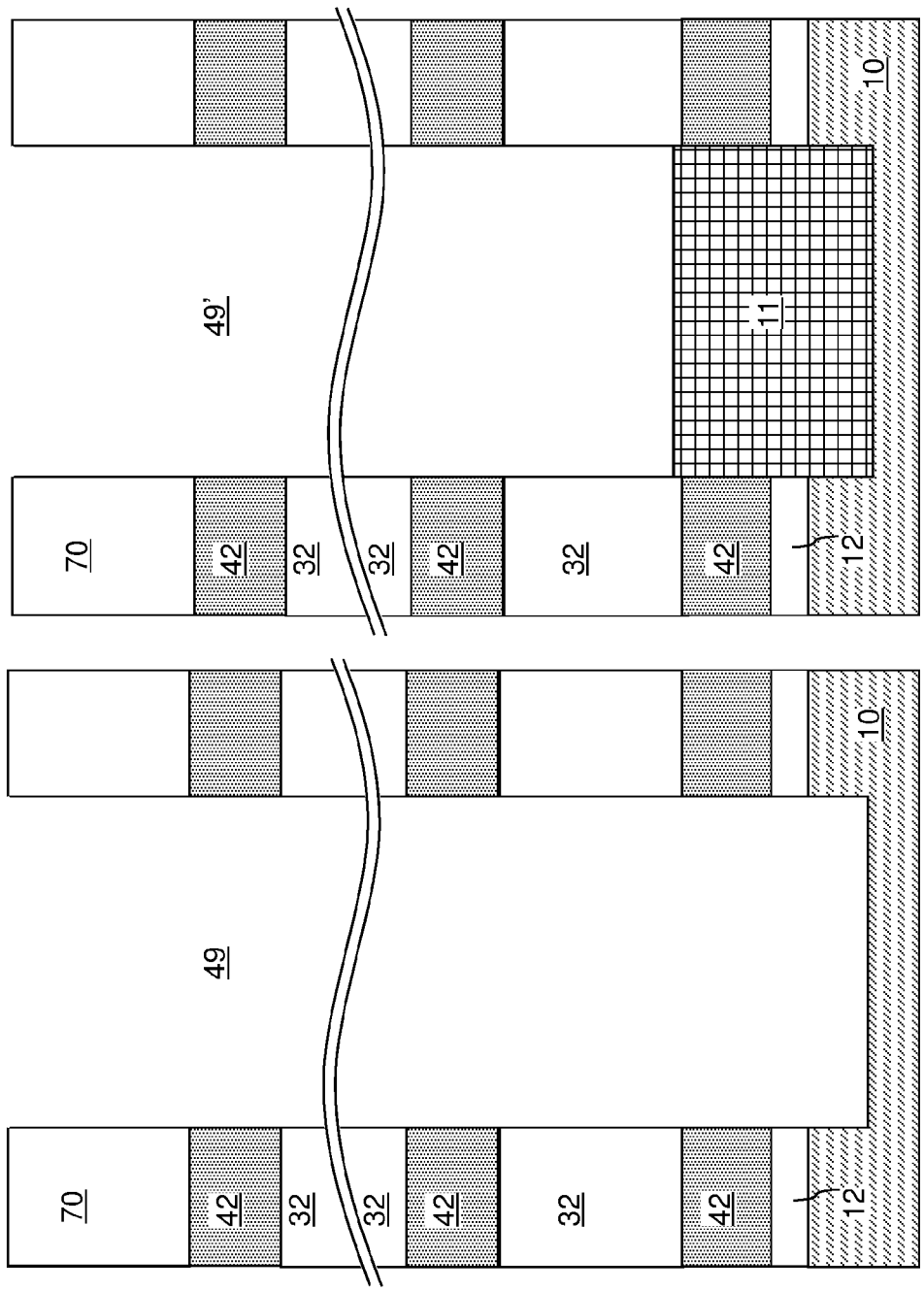

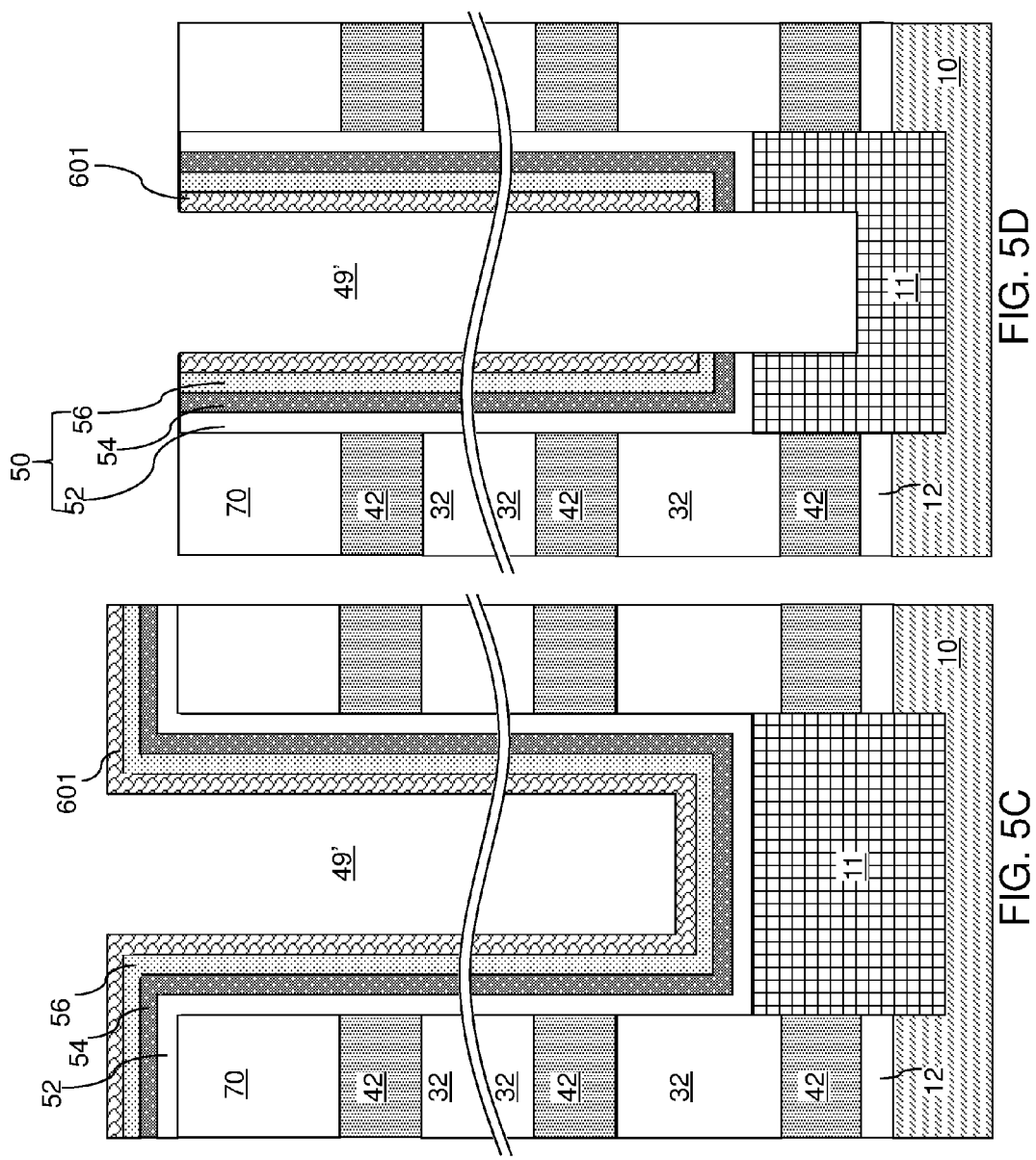

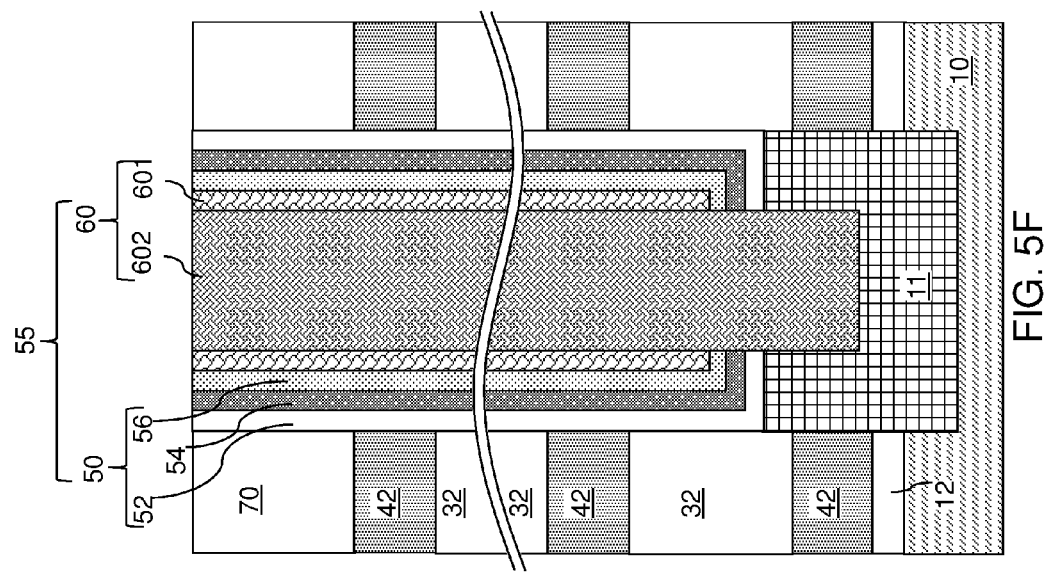
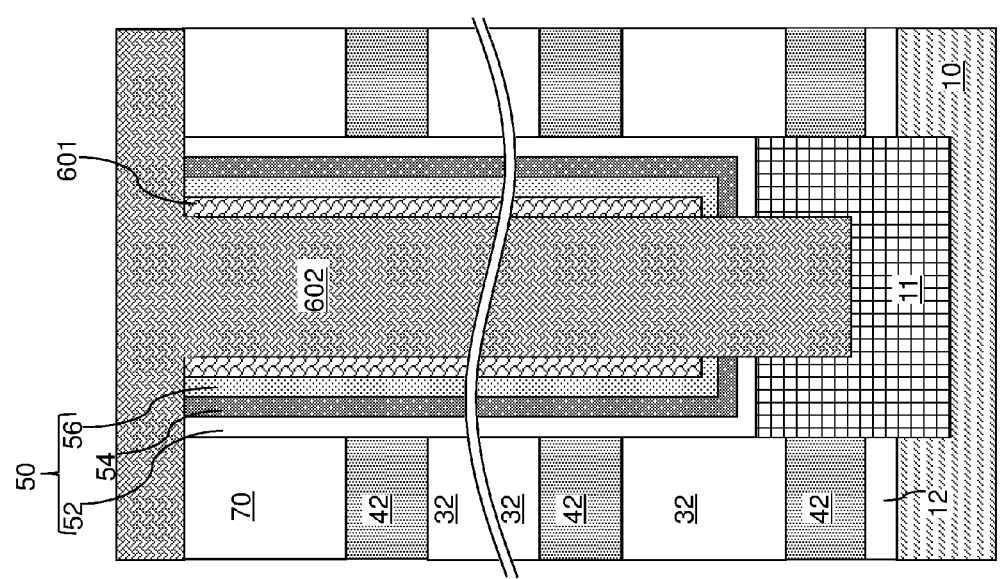

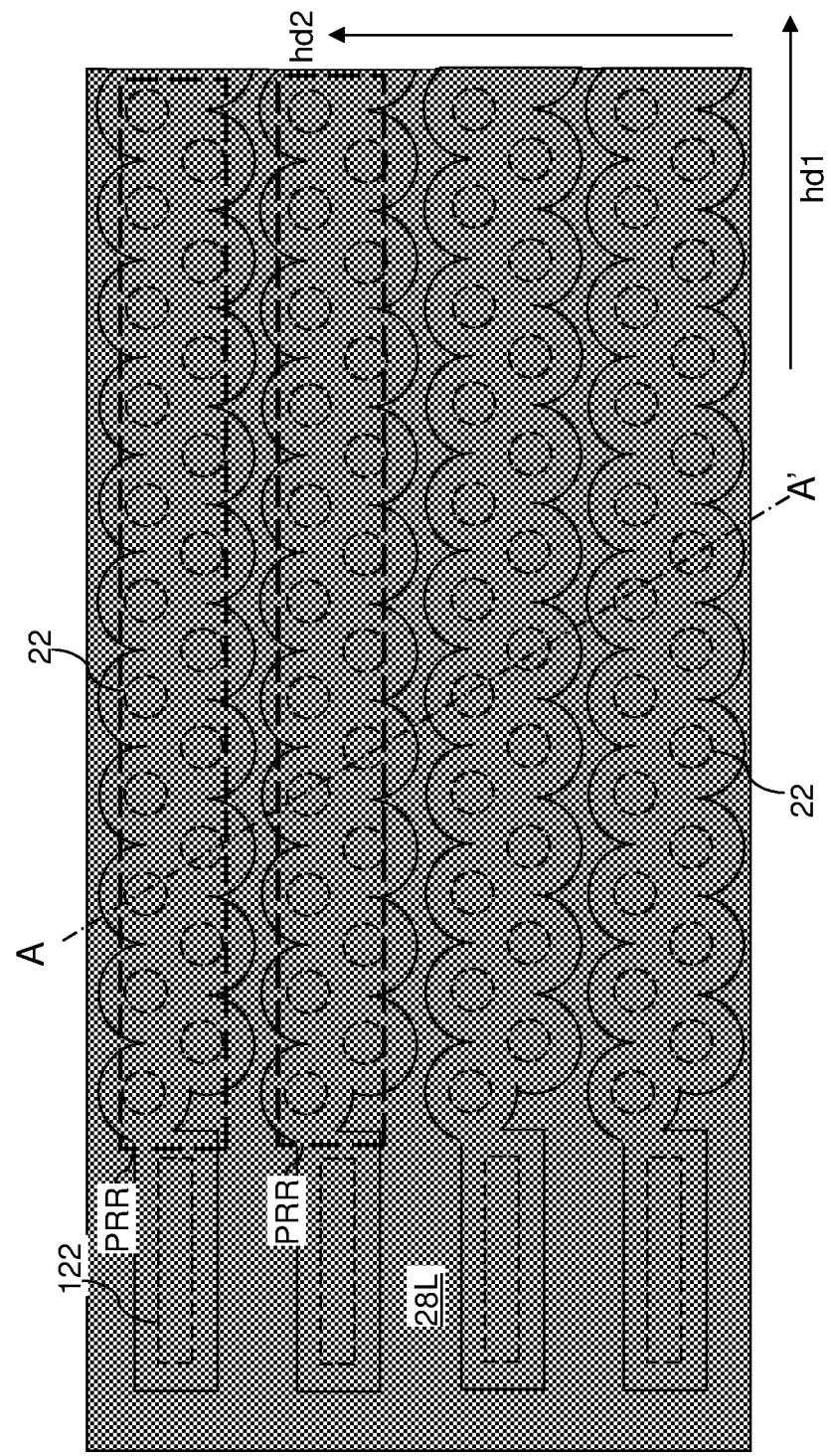

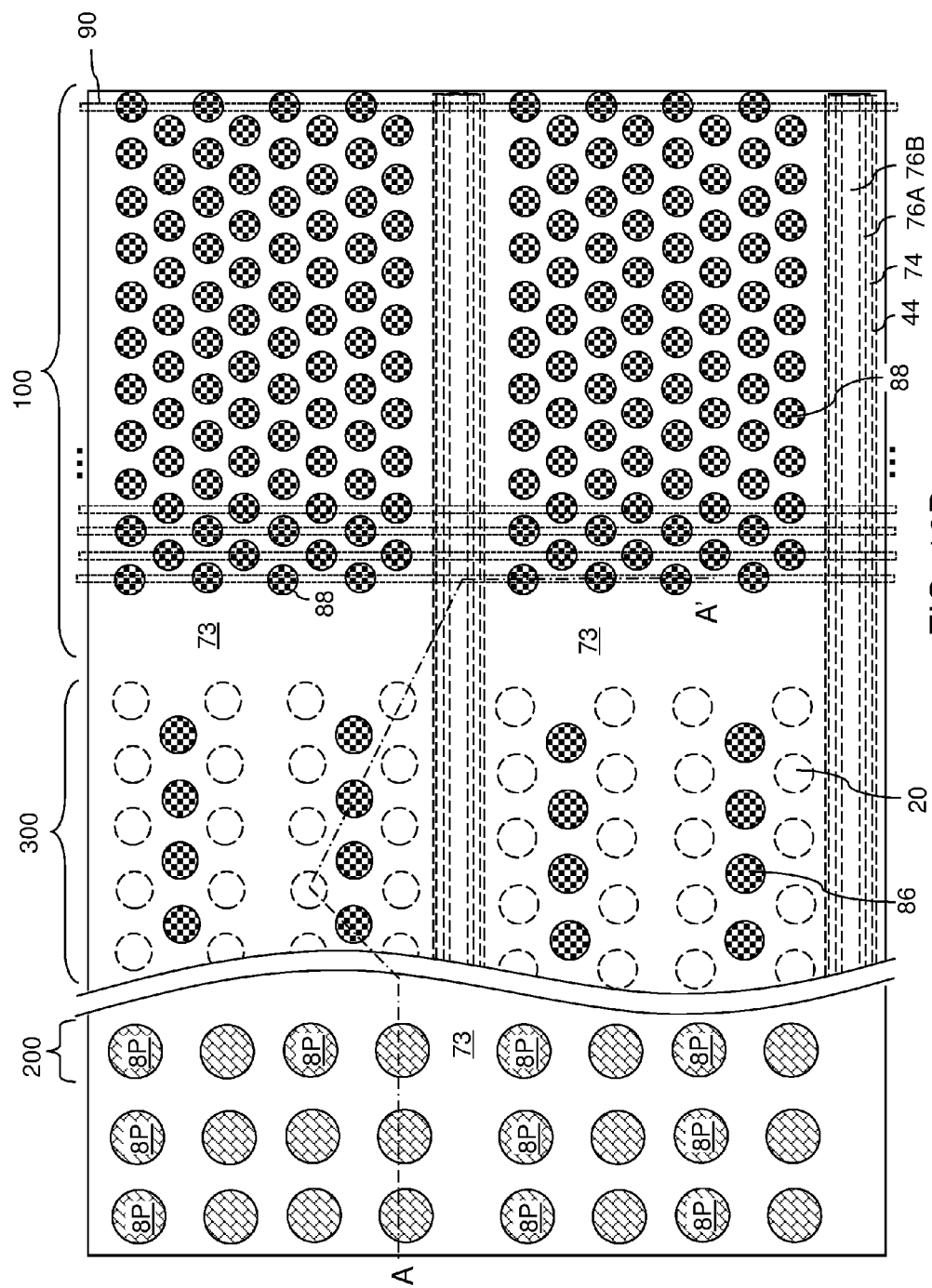

US 9,972,640 B1

THREE-DIMENSIONAL MEMORY DEVICE WITH SELF-ALIGNED DRAIN SIDE SELECT GATE ELECTRODES AND METHOD OF MAKING THEREOF

FIELD

The present disclosure relates generally to the field of semiconductor devices, and particular to a three-dimensional memory device employing self-aligned drain select level gate electrodes and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; memory stack structures extending through the alternating stack, wherein each of the memory stack structures comprises a memory film and a memory level channel portion contacting an inner sidewall of the memory film; drain select level channel portions overlying a respective memory level channel portion; drain select level gate dielectrics laterally surrounding, and contacting, a respective subset of the drain select level channel portions; and drain select level gate electrodes laterally surrounding respective drain select level gate dielectrics. In one embodiment, a geometrical center of each drain select level channel portion is laterally offset with respect to a geometrical center of the respective memory level channel portion. In another embodiment, the drain select level gate electrodes comprise convex outer sidewalls.

According to another aspect of the present disclosure, a method of forming a three-dimensional memory device is provided. An alternating stack of insulating layers and spacer material layers is formed over a substrate. The space material layers are formed as, or replaced with, electrically conductive layers. Memory stack structures are formed through the alternating stack. Each of the memory stack structures comprises a memory film and a memory level channel portion contacting an inner sidewall of the memory film. Drain select level channel portions are formed over the memory level channel portions. A geometrical center of each drain select level channel portion is laterally offset with respect to a geometrical center of a respective underlying memory level channel portion. Drain select level gate dielectrics are formed on, and around, the drain select level channel portions. Drain select level gate electrodes are formed around the drain select level gate dielectrics.

BRIEF DESCRIPTION OF THE DRAWINGS

FIGS. 5A-5F are sequential schematic vertical cross-sectional views of a memory opening during formation of a memory stack structure according to an embodiment of the present disclosure.

FIG. 9B is a top-down view of the exemplary structure of FIG. 9A. The vertical plane A-A' is the plane of the schematic vertical cross-sectional view of FIG. 9A.

FIG. 19B is a top-down view of the exemplary structure of FIG. 19A. The vertical plane A-A' is the plane of the schematic vertical cross-sectional view of FIG. 19A.

DETAILED DESCRIPTION

Figure 1:
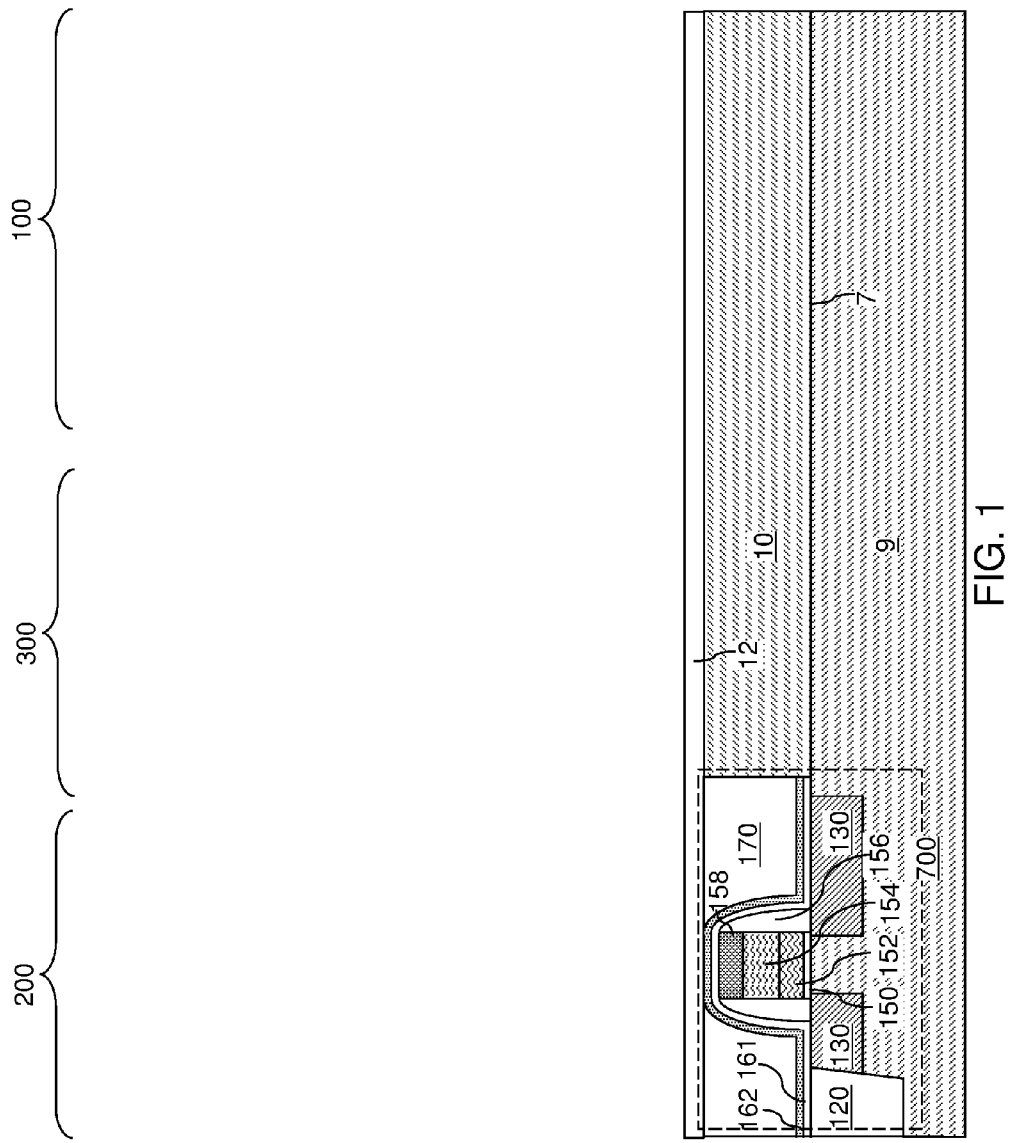
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to three-dimensional memory devices including self-aligned drain select level gate electrodes (i.e., drain side select gate electrodes, "SGD") and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170. The semiconductor material layer 10 can be doped with electrical dopants of a first conductivity type, which can be p-type or n-type, The region (i.e., area) of the at least one semiconductor device 700 is herein referred to as a peripheral device region 200. The device region in which a memory array is subsequently formed is herein referred to as a memory array region 100. A contact region 300 for subsequently forming stepped terraces of electrically conductive layers can be provided between the memory array region 100 and the peripheral device region 200. Optionally, a gate dielectric layer 12 can be formed above the semiconductor material layer 10 and the planarization dielectric layer 170. The gate dielectric layer 12 can be, for example, silicon oxide layer. The thickness of the gate dielectric layer 12 can be in a range from 3 nm to 30 nm, although lesser and greater thicknesses can also be employed.

Figure 2:
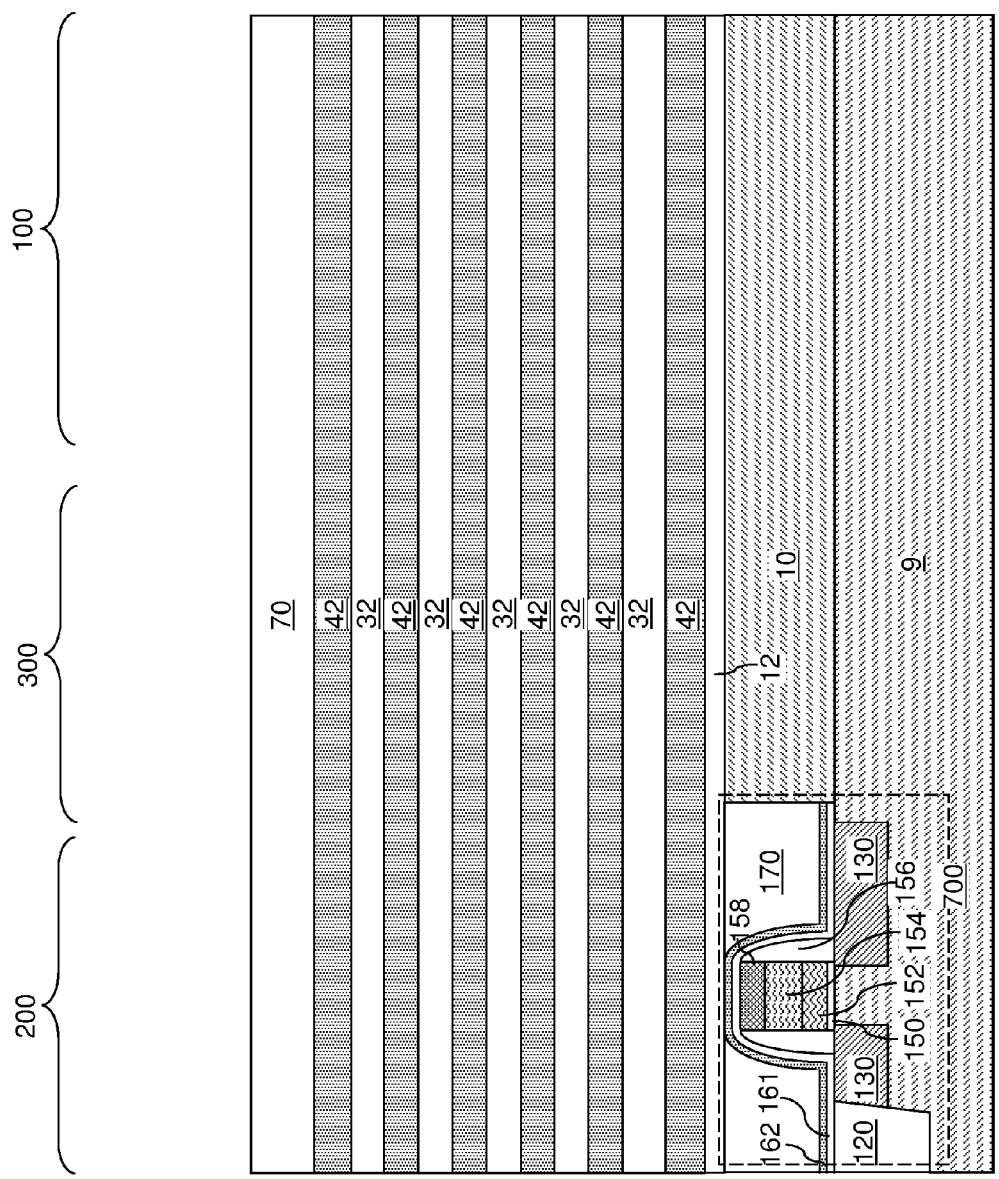
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
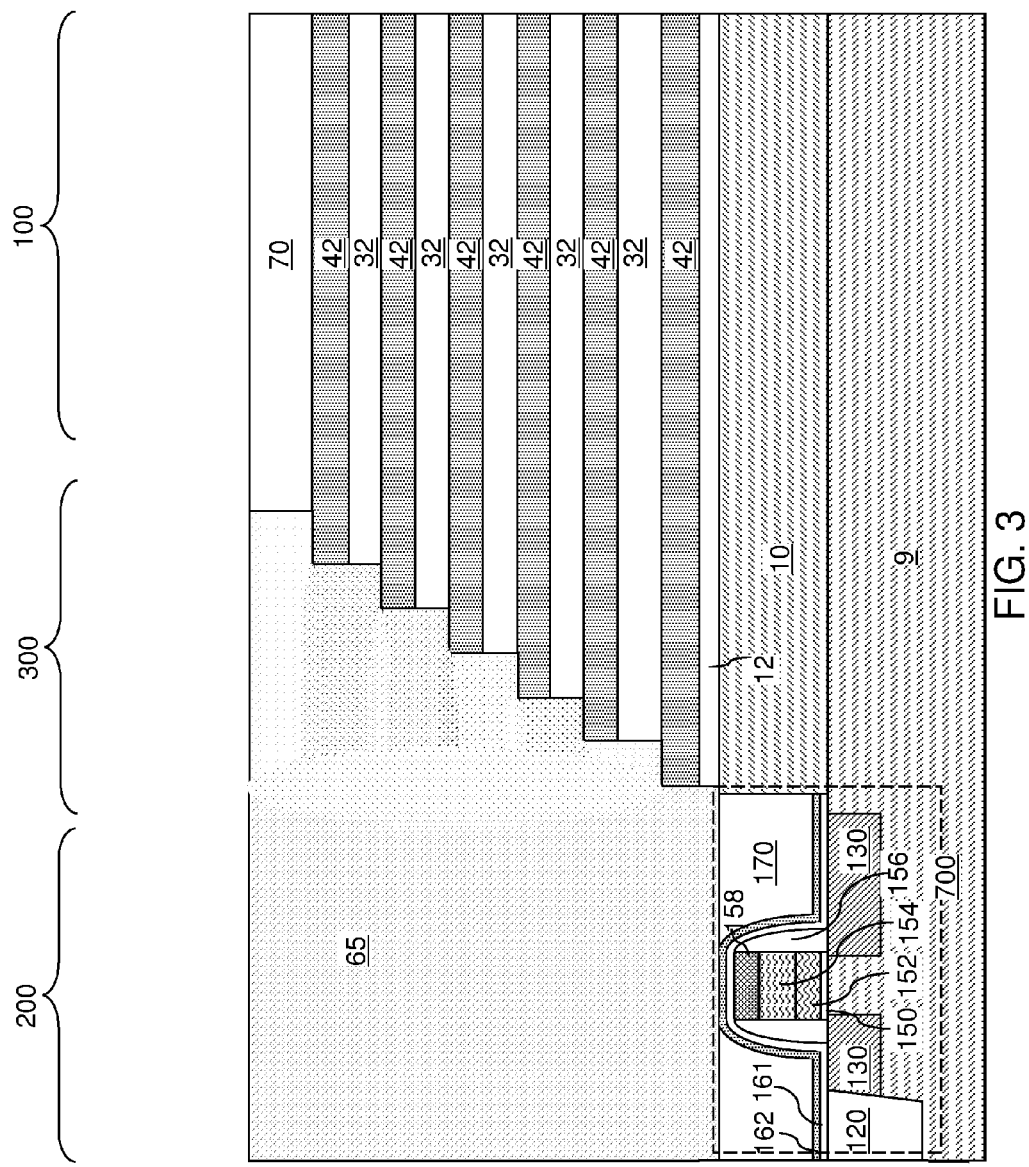
FIG. 3 is a schematic vertical cross-sectional view of the exemplary structure after formation of stepped terraces and a retro-stepped dielectric material portion according to an embodiment of the present disclosure.

Referring to FIG. 3, a stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 (i.e., isolation structures formed at the drain side select gate electrode level) can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
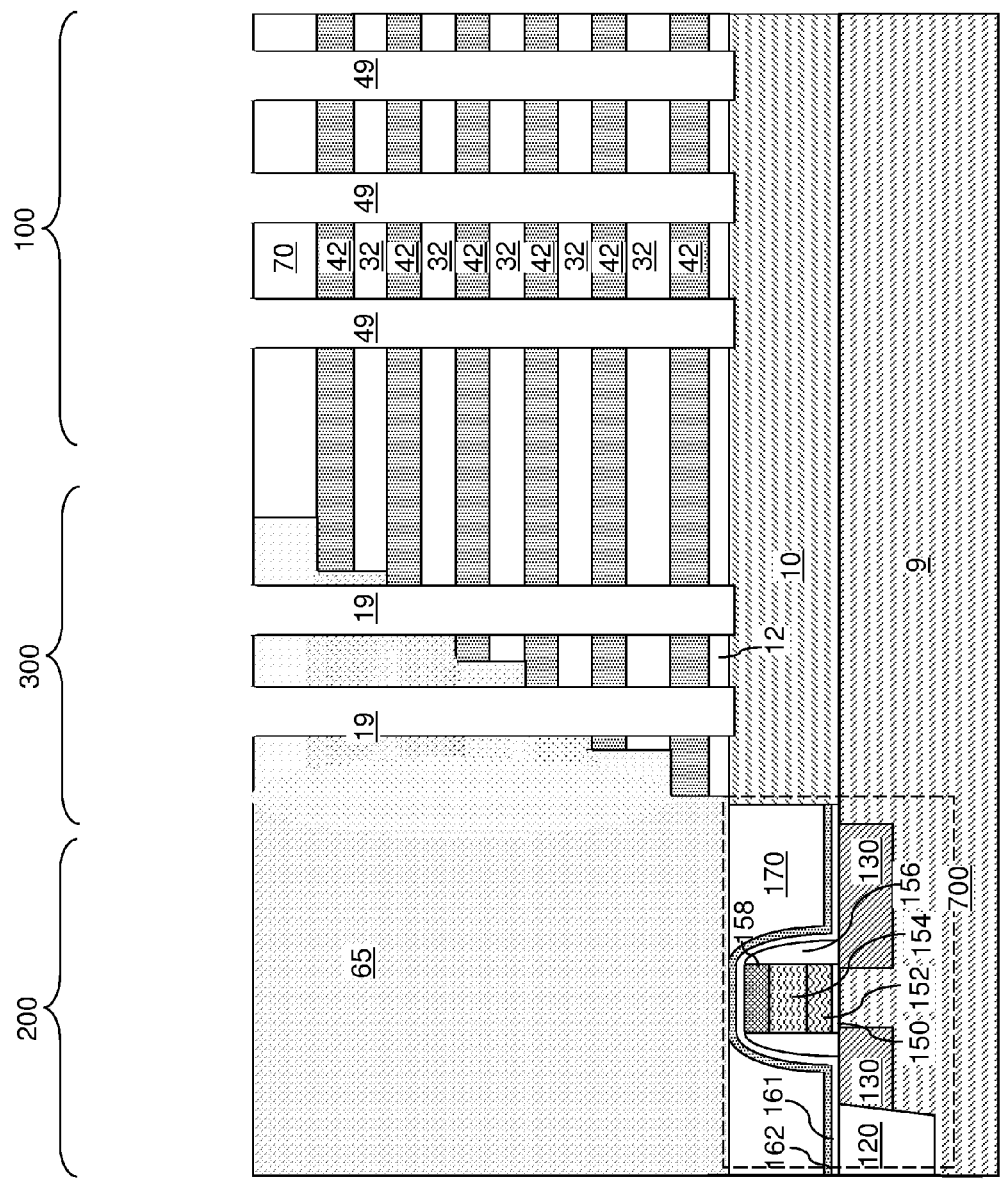
FIG. 4A is a schematic vertical cross-sectional view of the exemplary structure after formation of memory openings and support openings according to an embodiment of the present disclosure.
Figure 4B:
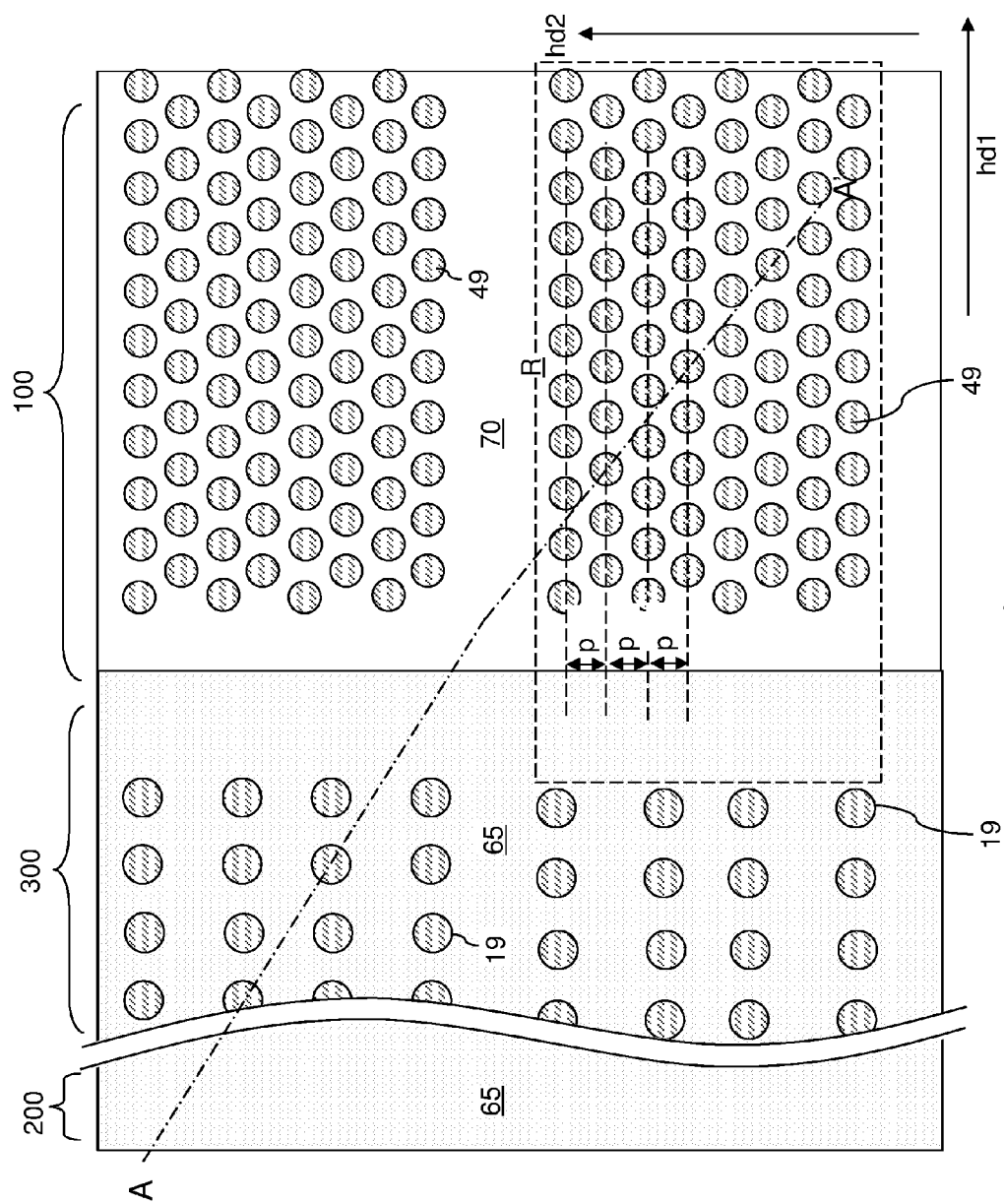
FIG. 4B is a top-down view of the exemplary structure of FIG. 4A. The vertical plane A-A' is the plane of the cross-section for FIG. 4A. Region R illustrated in FIG. 4B corresponds to the area shown in FIG. 7B.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can be formed through the gate dielectric layer 12 so that the memory openings 49 and the support openings 19 extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

In one embodiment, the memory openings 49 can be formed as a two-dimensional periodic array including rows that extend along a first horizontal direction hd1 and having a uniform inter-row pitch p along a second horizontal direction hd2, which can be perpendicular to the first horizontal direction hd1. In one embodiment, a plurality of two-dimensional periodic arrays can be formed such that each two-dimensional periodic array is formed as a cluster that is laterally spaced from a neighboring two-dimensional periodic array along the second horizontal direction. Each two-dimensional periodic array can include respective rows that extend along the first horizontal direction hd1 and have a uniform inter-row pitch p along the second horizontal direction hd2.

FIGS. 5A-5F illustrate structural changes in a memory opening 49, which is one of the memory openings 49 in the exemplary structure of FIGS. 4A and 4B, during formation of a memory stack structure. The same structural change occurs simultaneously in each of the other memory openings 49 and the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), the gate dielectric layer 12, and optionally into an upper portion of the semiconductor material layer 10. At this processing step, each support opening 19 can extend through the retro-stepped dielectric material portion 65, a subset of layers in the alternating stack (32, 42), the gate dielectric layer 12, and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional epitaxial channel portion (e.g., an epitaxial pedestal) 11 can be formed at the bottom portion of each memory opening 49 and each support openings 19, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer. The epitaxial channel portion 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the epitaxial channel portion 11. In one embodiment, the epitaxial channel portion 11 can comprise single crystalline silicon. In one embodiment, the epitaxial channel portion 11 can have a doping of the first conductivity type, which is the same as the conductivity type of the semiconductor material layer 10 that the epitaxial channel portion contacts. If a semiconductor material layer 10 is not present, the epitaxial channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by anisotropic etch process.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the epitaxial channel portion 11 (or a surface of the semiconductor substrate layer 10 in case the epitaxial channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the epitaxial channel portion 11 (or the semiconductor substrate layer 10 if portion 11 is omitted), and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may fully fill the cavity in each memory opening 49.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a memory level channel portion 60 through which electrical current can flow when a vertical NAND device including the memory level channel portion 60 is turned on. A tunneling dielectric layer 56 is surrounded by a charge storage layer 54, and laterally surrounds a portion of the memory level channel portion 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 6:
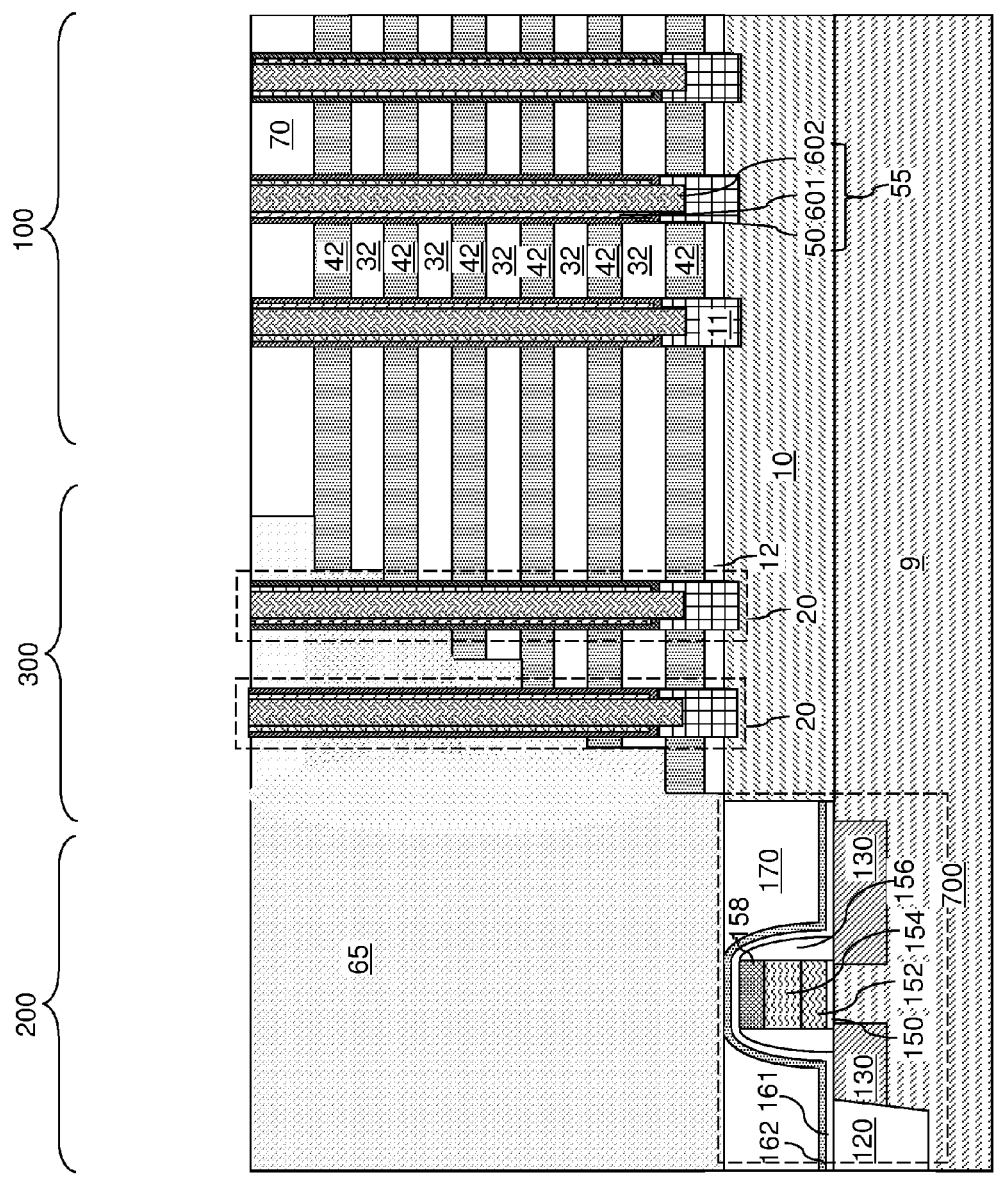
FIG. 6 is a schematic vertical cross-sectional view of the exemplary structure after formation of the memory stack structures according to an embodiment of the present disclosure.

Referring to FIG. 6, the exemplary structure is illustrated after the processing steps of FIG. 5F. Each combination of a memory film 50 and a memory level channel portion 60 (which is a portion of a vertical semiconductor channel) within a memory opening 49 constitutes a memory stack structure 55. The memory stack structure 55 is a combination of a memory level channel portion 60, a tunneling dielectric layer 56, a plurality of memory elements as embodied as portions of the charge storage layer 54, and an optional blocking dielectric layer 52. Each combination of an epitaxial channel portion 11 and a memory stack structure 55 is herein referred to as a memory opening fill structure (11, 55). Each combination of an epitaxial channel portion 11, a memory film 50, and a memory level channel portion 60 within each support opening 19 fills the respective support openings 19, and constitutes a support pillar structure 20 (i.e., a dummy structure which is not electrically connected to a bit line).

An instance of a memory opening fill structure (11, 55) can be formed within each memory opening 49 of the structure of FIGS. 4A and 4B. An instance of the support pillar structure 20 can be formed within each support opening 19 of the structure of FIGS. 4A and 4B. Each exemplary memory stack structure 55 includes a memory level channel portion 60, which may comprise multiple semiconductor channel layers (601, 602), and a memory film 50. The memory film 50 may comprise a tunneling dielectric layer 56 laterally surrounding the memory level channel portion 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the memory level channel portion 60.

Figure 7B:
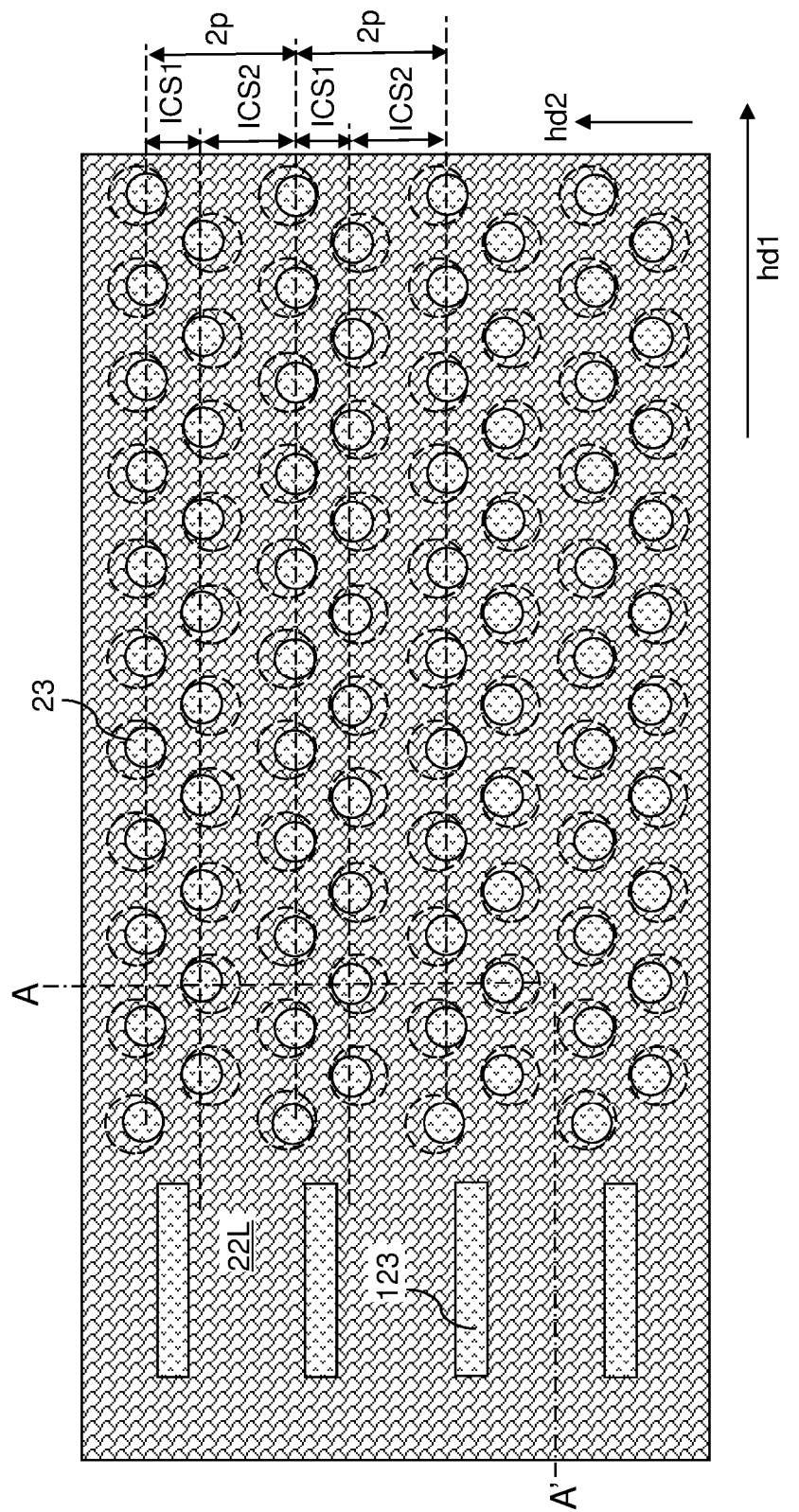
FIG. 7B is a top-down view of the exemplary structure of FIG. 7A. The vertical plane A-A' is the plane of the schematic vertical cross-sectional view of FIG. 7A.
Figure 7A:
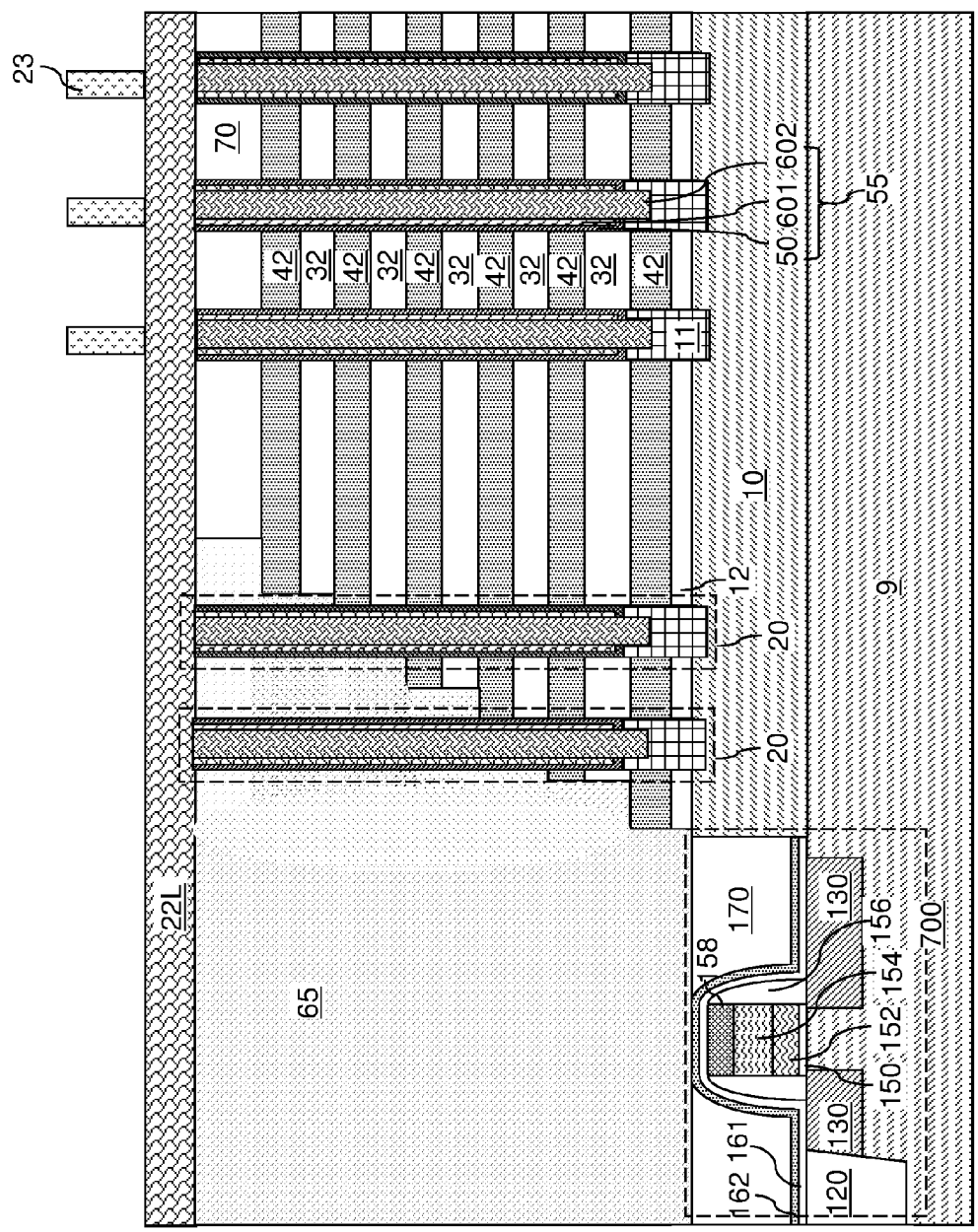
FIG. 7A is a schematic vertical cross-sectional view of the exemplary structure after formation of a drain select level (drain side select gate electrode level) semiconductor material layer and patterned resist portions according to an embodiment of the present disclosure.

Referring to FIGS. 7A and 7B, a drain select level semiconductor material layer 22L is formed over the insulating cap layer 70. The area illustrated in FIG. 7B corresponds to region R illustrated in FIG. 4B. The drain select level semiconductor material layer 22L includes a semiconductor material, which may be the same as, or different from, the material of the first semiconductor channel layer 601, and may be the same as, or different from, the material of the second semiconductor channel layer 602. In one embodiment, the drain select level semiconductor material layer 22L may be intrinsic, or may have a doping of the first conductivity type, which is the same as the conductivity type of the semiconductor material layer 10, such as intrinsic or p-type polysilicon or amorphous silicon. In one embodiment, the drain select level semiconductor material layer 22L can have a dopant concentration that is optimized for effective selection and de-selection of the underlying memory level channel portion 60. In one embodiment, the drain select level semiconductor material layer 22L may have the same dopant concentration as, or a different dopant concentration from, the dopant concentration of the memory level channel portion 60. In one embodiment, the atomic concentration of dopants of the first conductivity type in the drain select level semiconductor material layer 22L can be in a range from $1.0 \times 10^{14}/cm^3$ to $1.0 \times 10^{17}/cm^3$, although lesser and greater dopant concentrations can also be employed.

The drain select level semiconductor material layer 22L can be formed by a conformal deposition process or a non-conformal deposition process. For example, the drain select level semiconductor material layer 22L can be formed by plasma enhanced chemical vapor deposition (PECVD) or low pressure chemical vapor deposition (LPCVD). The thickness of the drain select level semiconductor material layer 22L can be in a range from 20 nm to 200 nm, although lesser and greater thicknesses can also be employed.

Patterned photoresist portions (23, 123) can be formed over the drain select level semiconductor material layer 22L by applying a photoresist layer over the drain select level semiconductor material layer 22L, and lithographically patterning the photoresist layer by lithographic exposure and development. The patterned photoresist portions (23, 123) can include pillar-shaped photoresist portions 23 and elongated photoresist portions 123. The pillar-shaped photoresist portions 23 can have substantially circular or elliptical horizontal cross-sectional shapes, and can be arranged in rows that extend along the first horizontal direction hd1 and having a periodically modulated inter-row center-to-center spacing (ICS1, ICS2) the sum of which having a periodicity of twice the inter-row pitch p of the two-dimensional periodic array of the memory stack structures 55 (i.e., ICS1+ICS2=2p). As used herein, an "inter-row center-to-center" spacing between a first row of elements and a second row of elements refers to the distance between a first vertical plane passing through geometrical centers of elements within the first row and a second vertical plane passing through geometrical centers of elements within the second row. As used herein, a "geometrical center" of an element refers to the center of mass of a hypothetical object having the same volume as the element and having a uniform density throughout.

In one embodiment, the pillar-shaped photoresist portions 23 can be arranged as pairs of rows that extend along the first horizontal direction hd1 having a first inter-row center-to-center spacing ICS1 that is less than the uniform pitch p of the memory stack structures 55 along the second horizontal direction hd2. Adjacent rows that belong to two different neighboring pairs of rows have a second inter-row center-to-center spacing ICS2, which is greater than the uniform pitch p of the memory stack structures 55 and greater than the first inter-row center-to-center spacing ICS1. In one embodiment, the first inter-row center-to-center spacing ICS1 can be in a range from 40% of the uniform pitch p to 95% of the uniform pitch p, such as from 60% of the uniform pitch to 80% of the uniform pitch. The second inter-row center-to-center spacing ICS2 can be in a range from 105% of the uniform pitch p to 160% of the uniform pitch p, such as from 120% of the uniform pitch to 140% of the uniform pitch. The sum of the first inter-row center-to-center spacing ICS1 and the second inter-row center-to-center spacing ICS2 can be twice the uniform pitch p of the memory stack structures 55.

The elongated photoresist portions 123 can be located over the area of the retro-stepped dielectric material portion 65. In one embodiment, each elongated photoresist portion 123 can be elongated along the first horizontal direction hd1. The width of each elongated photoresist portion 123 can be in a range from 40% of the uniform pitch p of the memory stack structures 55 to 100% of the uniform pitch p of the memory stack structures 55. An edge of each elongated photoresist portion 123 can be proximal to an outermost pillar-shaped photoresist portion 23 so that the gap between the elongated photoresist portion 123 and the outermost pillar-shaped photoresist portion 23 is comparable to the nearest neighbor distance within a pair of rows of pillar-shaped photoresist portions 23.

Figure 8A:
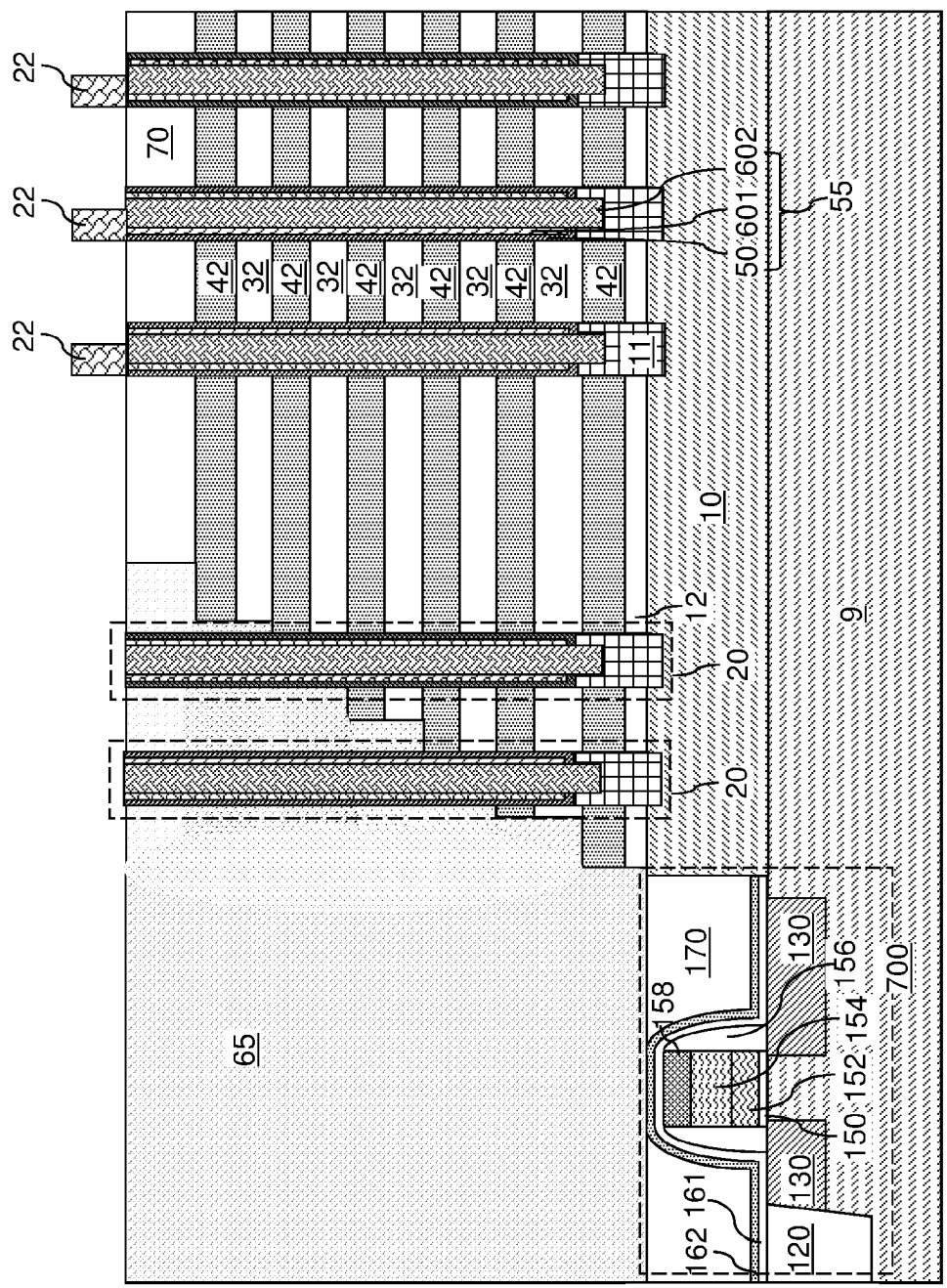
FIG. 8A is a schematic vertical cross-sectional view of the exemplary structure after formation of drain select level channel portions according to an embodiment of the present disclosure.
Figure 8B:
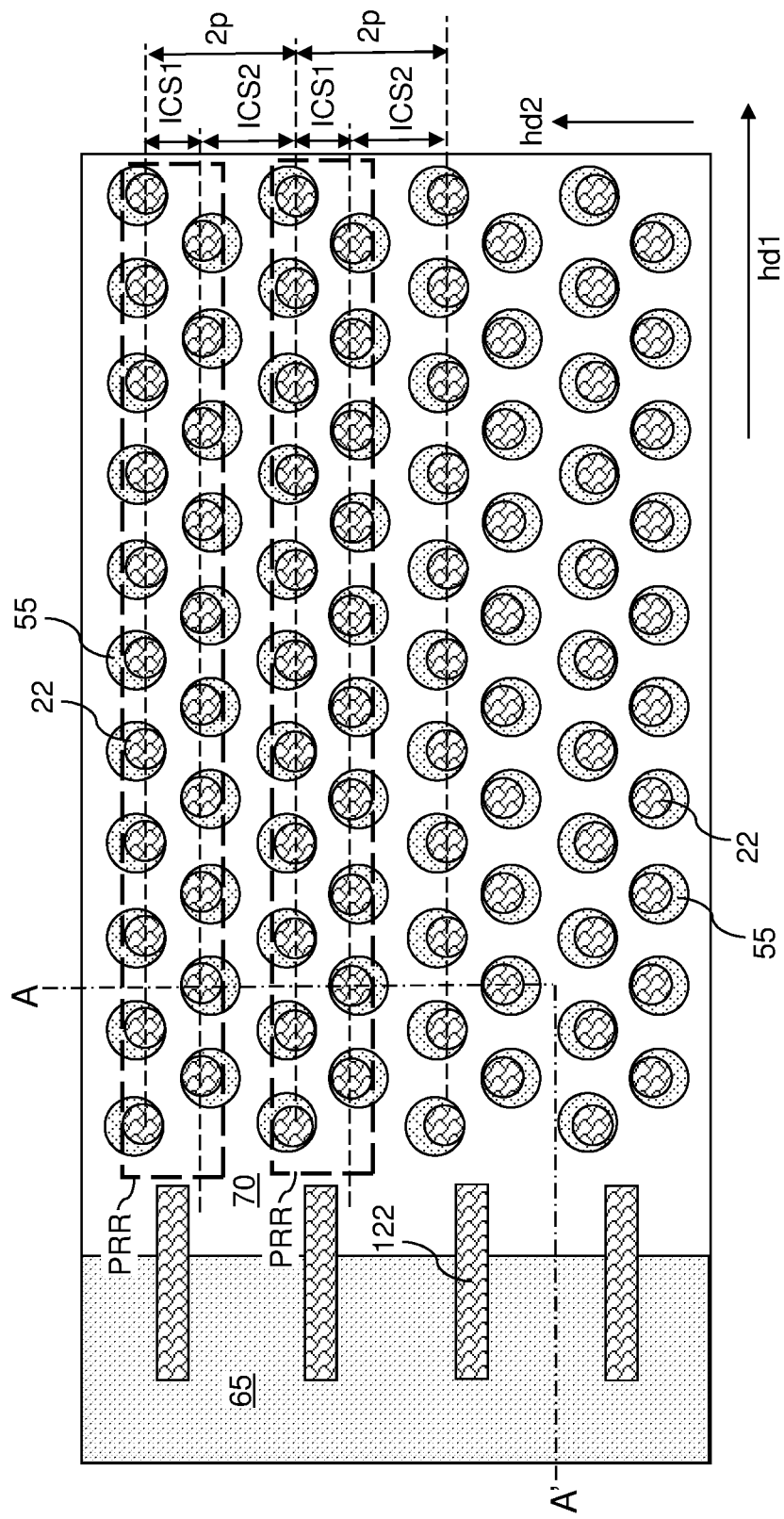
FIG. 8B is a top-down view of the exemplary structure of FIG. 8A. The vertical plane A-A' is the plane of the schematic vertical cross-sectional view of FIG. 8A.

Referring to FIGS. 8A and 8B, an anisotropic etch is performed to transfer the pattern of the patterned photoresist portions (23, 123) into the drain select level semiconductor material layer 22L (i.e., the select level semiconductor material layer 22L is etched using the patterned photoresist portions (23, 123) as a mask). The insulating cap layer 70 and the retro-stepped dielectric material portion 65 can be employed as etch stop layers. The remaining portions of the drain select level semiconductor material layer 22L that replicate the patterns of the pillar-shaped photoresist portions 23 constitute drain select level channel portions 22, which are incorporated into a respective semiconductor channel that includes one of the drain select level channel portions 22 and a respective underlying memory level channel portion 60. The remaining portions of the drain select level semiconductor material layer 22L that replicates the patterns of the elongated photoresist portions 123 constitute elongated semiconductor templates 122, which are adjacent to outermost drain select level channel portions 22.

The drain select level channel portions 22 are formed over the memory level channel portions 60. The geometrical center of each drain select level channel portion 22 is laterally offset with respect to the geometrical center of a respective underlying memory level channel portion 60 along the direction perpendicular to the first horizontal direction hd1, which can be the second horizontal direction hd2.

In one embodiment, the memory stack structures 55 can be formed as at least one two-dimensional periodic array including respective rows that extend along the first horizontal direction hd1. The two-dimensional periodic array can have the uniform inter-row pitch p along a second horizontal direction hd2. The drain select level channel portions 22 can be arranged in respective rows that extend along the first horizontal direction hd1 and having a periodically modulated inter-row center-to-center spacing (ICS1, ICS2) whose sum having a periodicity of twice the inter-row pitch p of the two-dimensional periodic array of the memory stack structures 55, i.e., 2p.

In one embodiment, the drain select level channel portions 22 can be arranged as pairs of rows PRR that extend along the first horizontal direction hd1. Each pair of rows PRR includes two rows of drain select level channel portions 22. Each row of drain select level channel portions 22 is arranged along the first horizontal direction hd1, and can have a periodic pitch along the first horizontal direction hd1. The periodic pitch can be the same with each row of drain select level channel portions 22. The two rows with each pair of rows PRR can have the first inter-row center-to-center spacing ICS1, which is less than the inter-row pitch p of the two-dimensional periodic array of the memory stack structures 55. As discussed above, the first inter-row center-to-center spacing ICS1 can be in a range from 40% of the uniform pitch p to 95% of the uniform pitch p, such as from 60% of the uniform pitch to 80% of the uniform pitch.

In one embodiment, each geometrical center of the drain select level channel portions 22 can be laterally offset from the geometrical center of the respective underlying memory level channel portion 60 that the drain select level channel portion 22 contacts along the second horizontal direction hd2, and not laterally offset along the first horizontal direction hd1. The lateral offset distance of each geometrical center of the drain select level channel portions 22 with respect the geometrical center of the underlying memory level channel portion 60 can be in a range from 2.5% of the uniform pitch p to 30% of the uniform pitch p. Within any give row of drain select level channel portion 22, the direction and magnitude of the lateral offset with respect to underlying memory level channel portions 60 can be the same for each drain select level channel portion 22. In one embodiment, the lateral offset of the geometrical center of the drain select level channel portions 22 with respect the geometrical center of the underlying memory level channel portion 60 can be equal in magnitude and opposite in direction for each alternate row of the drain select level channel portions 22. The drain select level channel portions 22 in each row are offset closer to each other in direction hd2 (e.g., bit line direction) to the adjacent row in the same pair of rows PRR, than to the adjacent row located in a different pair of rows PRR. Thus, the drain select level channel portions 22 located in adjacent rows of different pairs of rows PRR have the wider second inter-row center-to-center spacing ICS2 which can be in a range from 105% of the uniform pitch p to 160% of the uniform pitch p, such as from 120% of the uniform pitch to 140% of the uniform pitch.

Figure 9A:
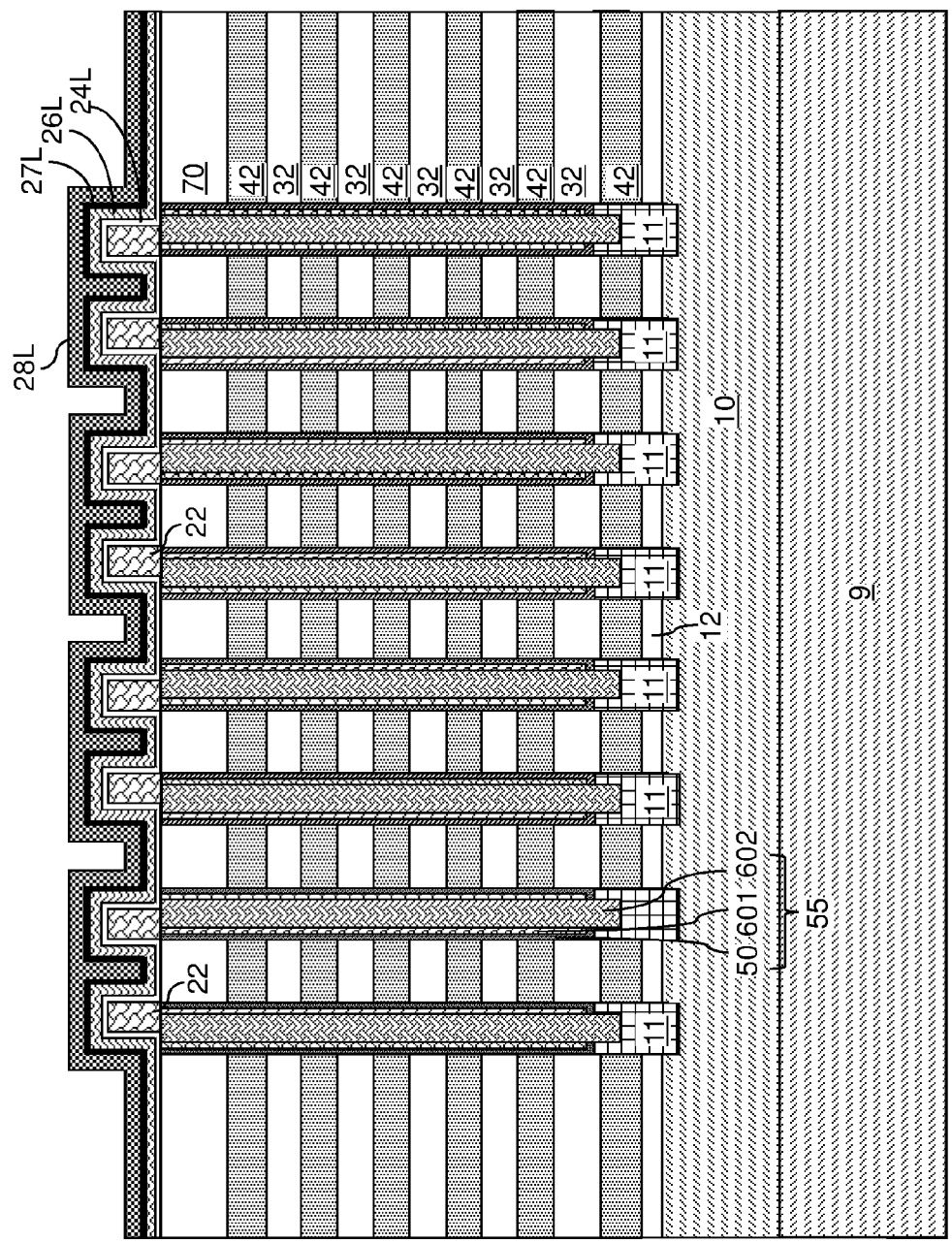
FIG. 9A is a schematic vertical cross-sectional view of the exemplary structure after formation of a drain select level gate dielectric layer (i.e., gate dielectric of the drain side select gate electrode) and drain select level (i.e., drain side) gate electrode layers according to an embodiment of the present disclosure.

Referring to FIGS. 9A and 9B, a drain select level gate dielectric layer 24L and at least one drain select level gate electrode layer (26L, 27L, 28L) can be sequentially deposited. The drain select level gate dielectric layer 24L includes at least one dielectric material layer, which can include a silicon oxide gate dielectric layer and/or a dielectric metal oxide gate dielectric layer. The drain select level gate dielectric layer 24L can be formed by deposition of at least one dielectric material by a respective conformal deposition (such as chemical vapor deposition or atomic layer deposition). Alternatively or additionally, a layer of the drain select level gate dielectric layer 24L may be formed by oxidation of surface portions of the drain select level channel portions 22. The thickness of the drain select level gate dielectric layer 24L can be in a range from 1.5 nm to 10 nm, such as from 2 nm to 7 nm, although lesser and greater thicknesses can also be employed.

The drain select level gate electrode layer (26L, 27L, 28L) includes at least one conductive material layer. For example, the drain select level gate electrode layer (26L, 27L, 28L) can include a layer stack, from bottom to top, of a doped semiconductor gate electrode layer 26L, a metallic nitride gate electrode layer 27L, and a metal gate electrode layer 28L. For example, the doped semiconductor gate electrode layer 26L can include a doped semiconductor material such as doped polysilicon, the metallic nitride gate electrode layer 27L can include a metallic nitride such as TiN, TaN, or WN, and the metal gate electrode layer 28L can include a metal such as W, Co, Mo, Ru, or an alloy thereof. For example, the layer stack may comprise a doped polysilicon layer 26L, titanium nitride layer 27L and tungsten layer 28L stack.

The total thickness of the drain select level gate dielectric layer 24L and the drain select level gate electrode layer (26L, 27L, 28L) is selected such that the material(s) of the drain select level gate electrode layer (26L, 27L, 28L) merge between the two rows of drain select level channel portions 22 within each pair of rows PRR of drain select level channel portions 22, but do(es) not merge between neighboring pairs of rows of drain select level channel portions 22.

In one embodiment, a continuous set of sidewalls of the drain select level gate electrode layer (26L, 27L, 28L) laterally surrounds a respective pair of rows PRR of drain select level channel portions 22 and a semiconductor template 122, but is not adjoined to any other continuous set of sidewalls of the drain select level gate electrode layer (26L, 27L, 28L) that laterally surrounds a different pair of rows PRR of drain select level channel portions 22.

Figure 10A:
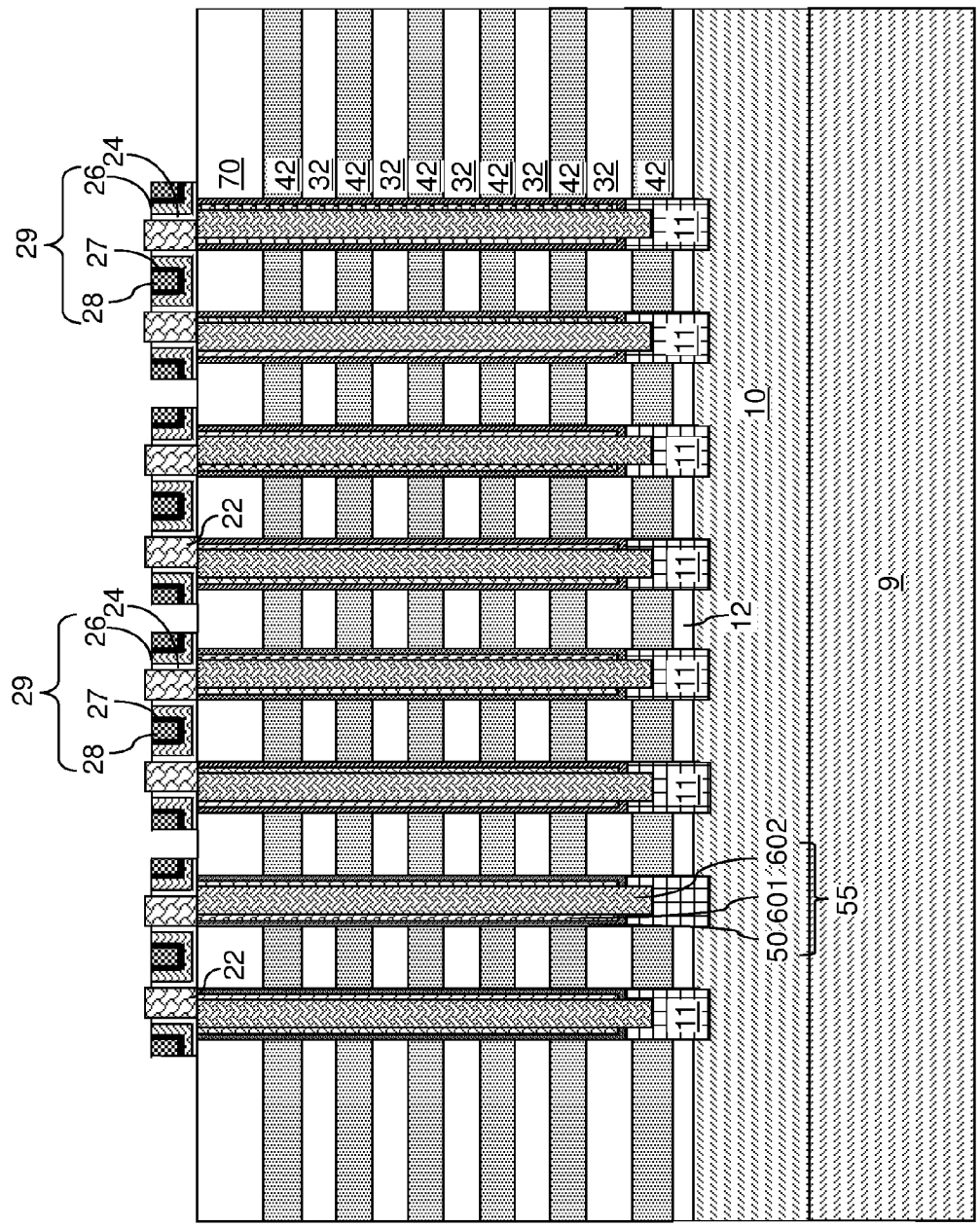
FIG. 10A is a schematic vertical cross-sectional view of the exemplary structure after formation of drain select level gate dielectrics and drain select level gate electrodes according to an embodiment of the present disclosure.
Figure 10B:
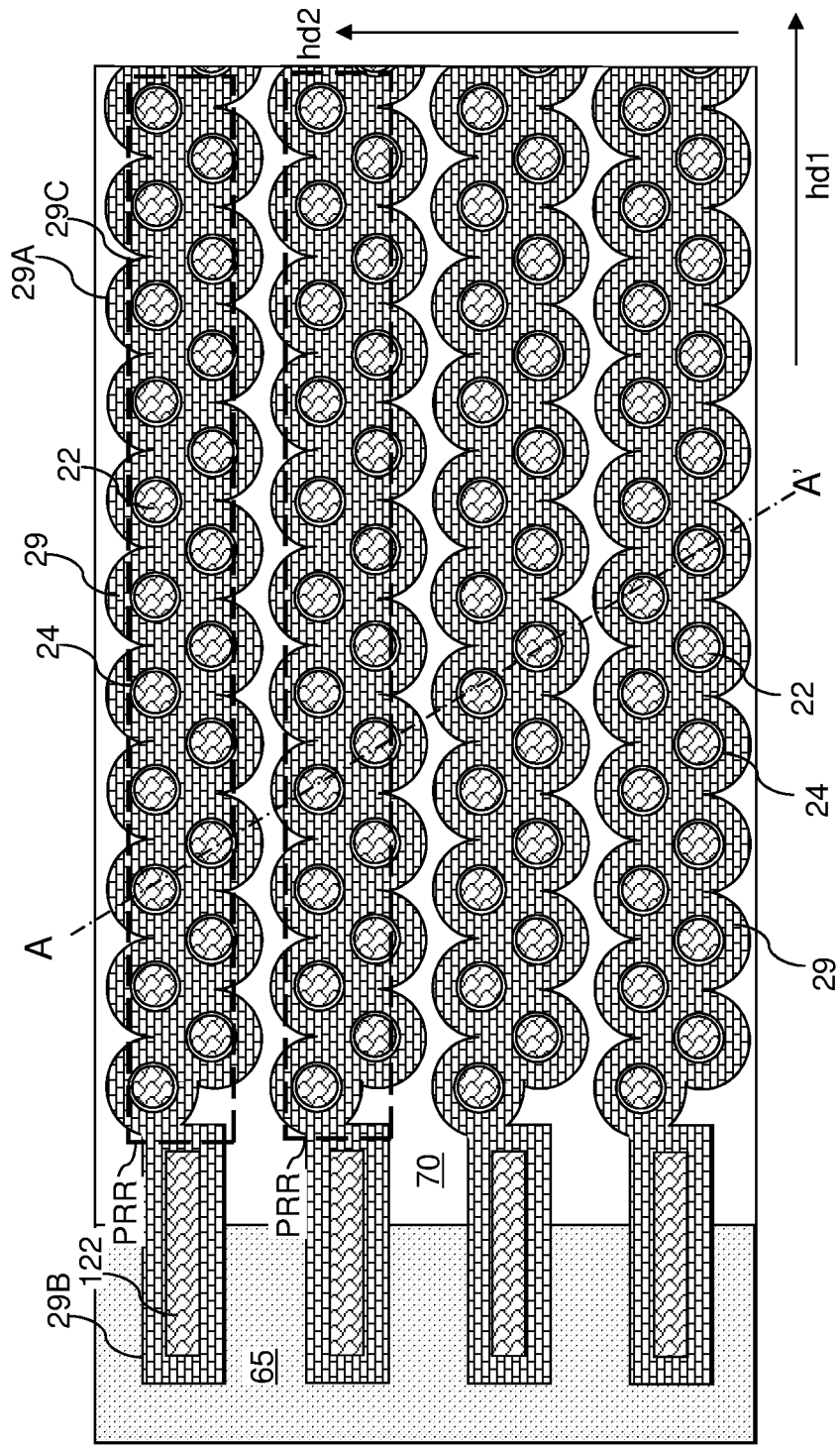
FIG. 10B is a top-down view of the exemplary structure of FIG. 10A. The vertical plane A-A' is the plane of the schematic vertical cross-sectional view of FIG. 10A.

Referring to FIGS. 10A and 10B, an anisotropic etch (e.g., sidewall spacer etch) is performed to remove horizontal portions of the drain select level gate electrode layer (26L, 27L, 28L) and the drain select level gate dielectric layer 24L. Horizontal portions of the stack of the drain select level gate dielectric layer (26L. 27L, 28L) and the drain select level gate electrode layer 24L are removed by the anisotropic etch. The anisotropic etch can uniformly recess the drain select level gate electrode layer (26L, 27L, 28L) and the drain select level gate dielectric layer 24L vertically. Thus, the anisotropic etch can remove portions of the drain select level gate electrode layer (26L, 27L, 28L) and the drain select level gate dielectric layer 24L that are located between pairs of rows PRR of the drain select level channel portions 22 or located above the horizontal plane including the top surface of the drain select level channel portions 22. Optionally, an overetch may be performed so that top surfaces of the remaining portions of the drain select level gate electrode layer (26L, 27L, 28L) are vertically recessed with respect to the horizontal plane including the top surface of the drain select level channel portions 22. In other words, the drain select level channel portions 22 can protrude above the drain select level gate electrode layer.

Each remaining discrete portion of the drain select level gate dielectric layer 24L is herein referred to as a drain select level gate dielectric 24. The drain select level gate dielectrics 24 are formed on, and around, the drain select level channel portions 22. Each drain select level gate dielectric 24 includes vertical portions having a tubular geometry and laterally surrounding a respective drain select level channel portion 22 and a horizontal portion that is adjoined to a bottom periphery of each of the vertical portions. Each drain select level gate dielectric 24 laterally encloses and surrounds each of the drain select level channel portions 22 within a respective pair of rows PRR of drain select level channel portions 22.

Each remaining discrete portion of the at least one drain select level gate electrode layer (26L, 27L, 28L) is herein referred to as a drain select level gate electrode 29. The drain select level gate electrodes 29 are formed around the drain select level gate dielectrics 24. Each drain select level gate electrode 29 can include a doped semiconductor gate electrode portion 26 which is a remaining portion of the doped semiconductor gate electrode layer 26L, a metallic nitride gate electrode portion 27 which is a remaining portion of the metallic nitride gate electrode layer 27L, and a metal gate electrode portion 28 which is a remaining portion of the metal gate electrode layer 28L. Each drain select level gate electrode 29 laterally encloses and surrounds each of the drain select level channel portions 22 within a respective pair of rows PRR of drain select level channel portions 22. In other words, the drain select level gate electrode 29 (i.e., the drain side select gate electrode, SGD) forms a sidewall spacer around the drain select level channel portion 22. The horizontal portion of each drain select level gate electrode 24 underlies a respective drain select level gate electrode 29.

The drain select level gate electrodes 29 are physically disjoined among one another along the gap between each pair of rows PRR of the drain select level channel portions 22. However, the drain select level gate electrodes 29 are adjoined (i.e., contact an adjacent electrode to form a continuous electrode) in each pair of rows PRR. Thus, the drain select level gate electrodes 29 are laterally spaced from one another along the second horizontal direction hd2 (e.g., bit line direction) because the second inter-row center-to-center spacing ICS2 between each pair of rows PRR is greater than the first inter-row center-to-center spacing ICS1 in each pair of rows PRR. The drain select level gate dielectrics 24 are physically disjoined among one another between each pair of rows PRR. Each drain select level gate dielectric 24 laterally surrounds, and contacts, a respective subset of the drain select level channel portions 22 that are arranged as a pair of rows PRR that laterally extend along the first horizontal direction hd1.

Figure 11A:
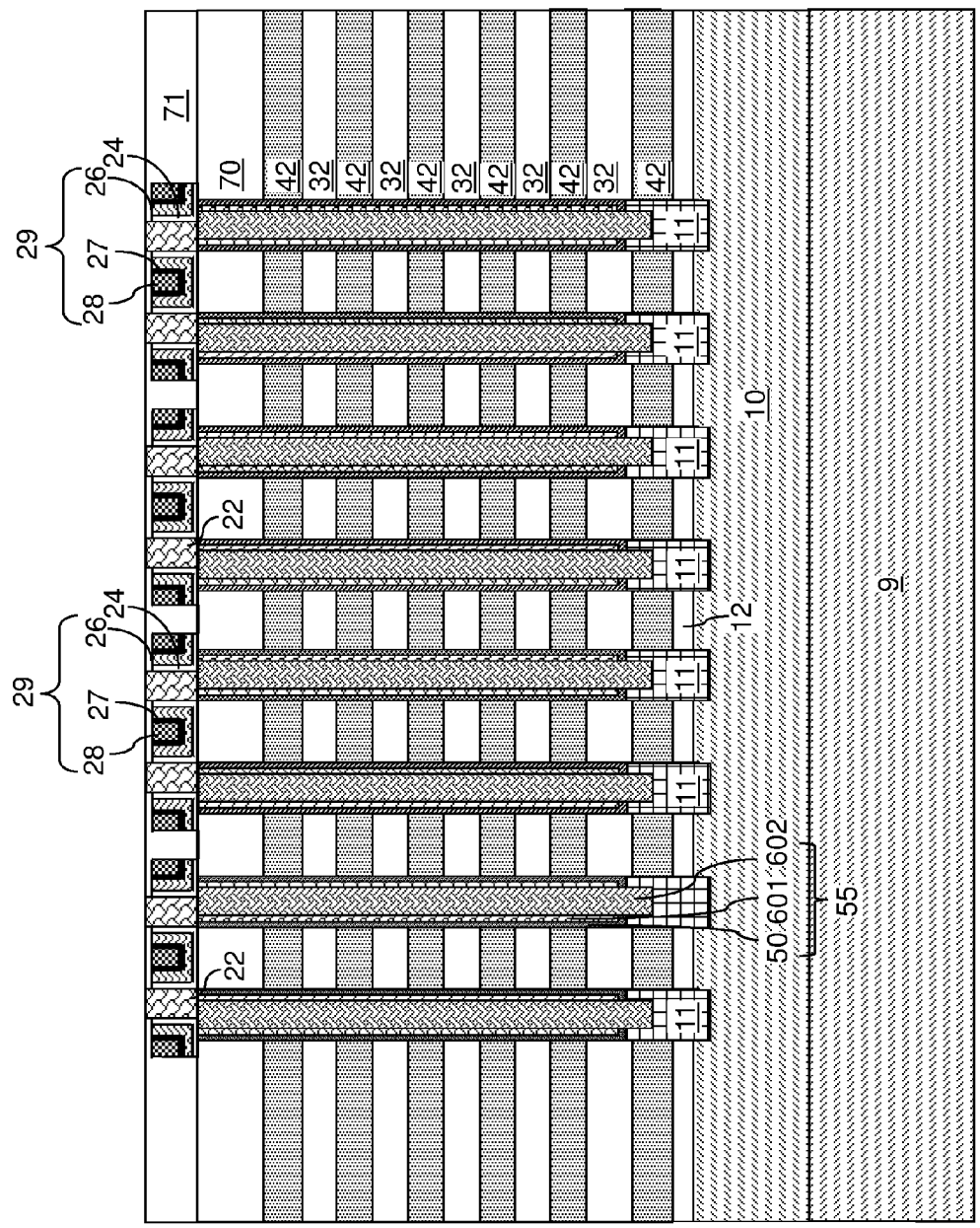
FIG. 11A is a schematic vertical cross-sectional view of the exemplary structure after formation of a drain select level dielectric layer according to an embodiment of the present disclosure.
Figure 11B:
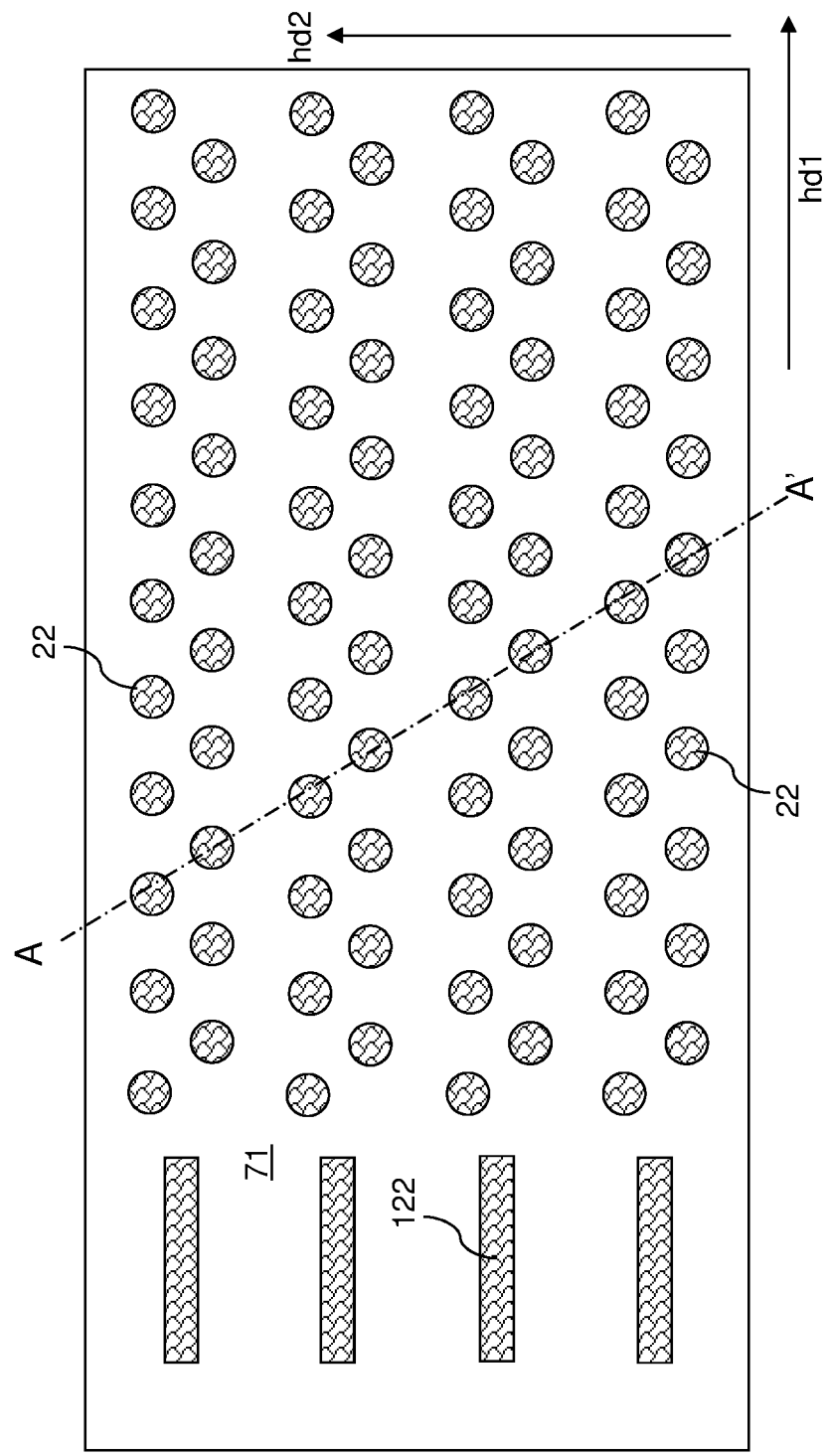
FIG. 11B is a top-down view of the exemplary structure of FIG. 11A. The vertical plane A-A' is the plane of the schematic vertical cross-sectional view of FIG. 11A.

Referring to FIGS. 11A and 11B, a drain select level dielectric layer 71 is formed over the drain select level gate electrodes 29. In one embodiment, the drain select level dielectric layer 71 can include a plurality of dielectric material layers. For example, the drain select level dielectric layer 71 can include a dielectric liner (which may include silicon nitride or a dielectric metal oxide) and a dielectric fill material layer (which may include a planarizable dielectric material such as silicon oxide). The deposited dielectric material(s) can be subsequently planarized by a planarization process that employs top surfaces of the drain select level channel portions 22 as stopping structures. In this case, the top surface of the drain select level dielectric layer 71 can be within the same horizontal plane as the top surface of the drain select level channel portions 22. The top surfaces of the select drain level gate electrodes 29 can be vertically spaced from the top surface of the drain select level dielectric layer 71.

Figure 12:
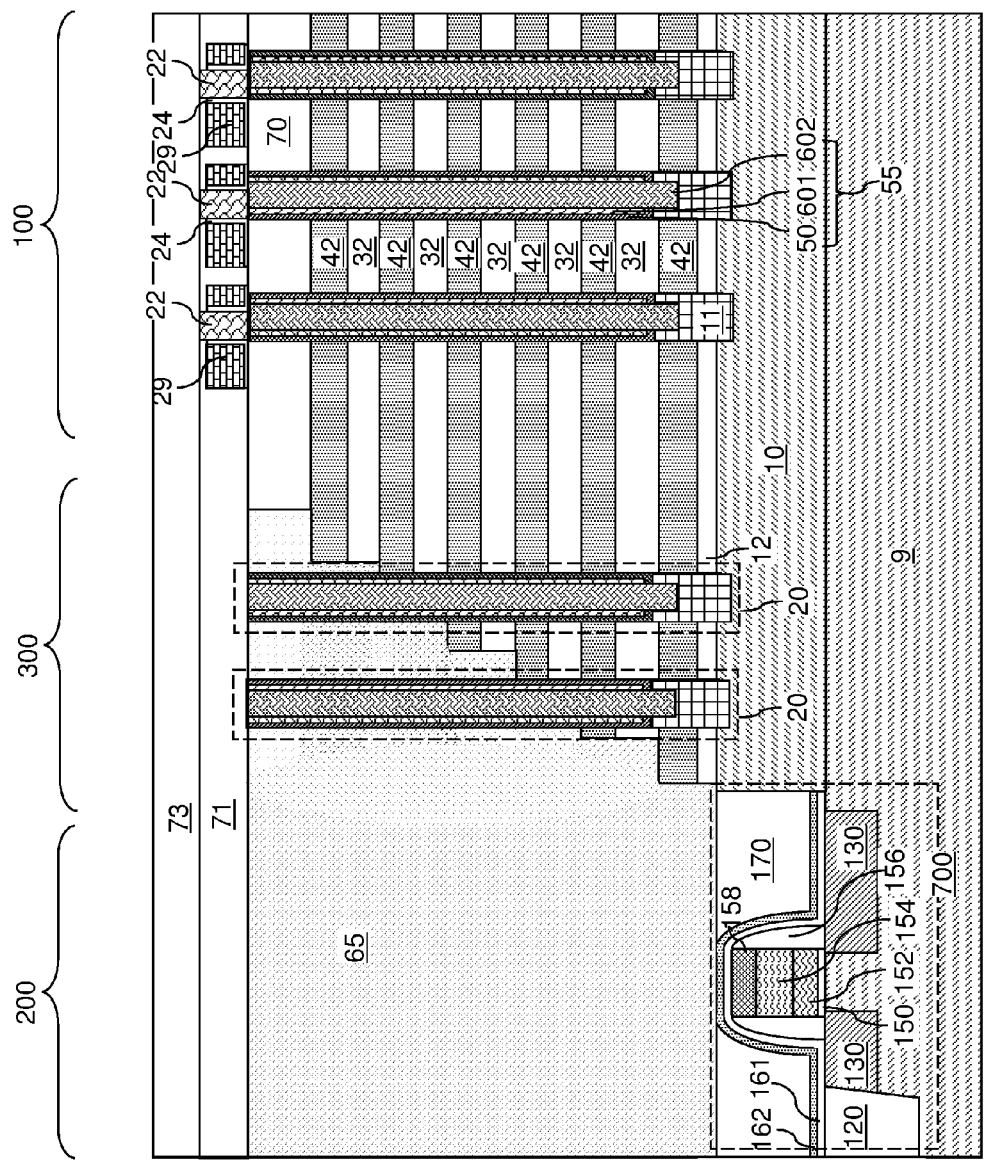
FIG. 12 is a vertical cross-sectional view of the exemplary structure after formation of a drain level dielectric material layer according to an embodiment of the present disclosure.

Referring to FIG. 12, a drain level dielectric material layer 73 can be formed over the drain select level dielectric layer 71. The drain level dielectric material layer 73 includes a dielectric material such as silicon oxide, organosilicate glass, silicon nitride, or a combination thereof. In one embodiment, the drain level dielectric material layer 73 can include silicon oxide. The thickness of the drain level dielectric material layer 73 can be in a range from 30 nm to 600 nm, such as from 60 nm to 300 nm, although lesser and greater thicknesses can also be employed. In one embodiment, the drain select level dielectric layer 71 and the drain level dielectric material layer 73 can be formed as two distinct material layers. Alternatively, the drain select level dielectric layer 71 and the drain level dielectric material layer 73 can be deposited in a same deposition step as a single continuous material portion. In this case, the deposited material can be planarized, for example, by chemical mechanical planarization to provide a planar top surface that is formed above the horizontal plane including the top surfaces of the drain select level channel portions 22. Alternatively, the drain level dielectric material layer 73 may be formed in a subsequent processing step, for example, after replacement of the sacrificial material layers 42 with electrically conductive layers.

Figure 13A:
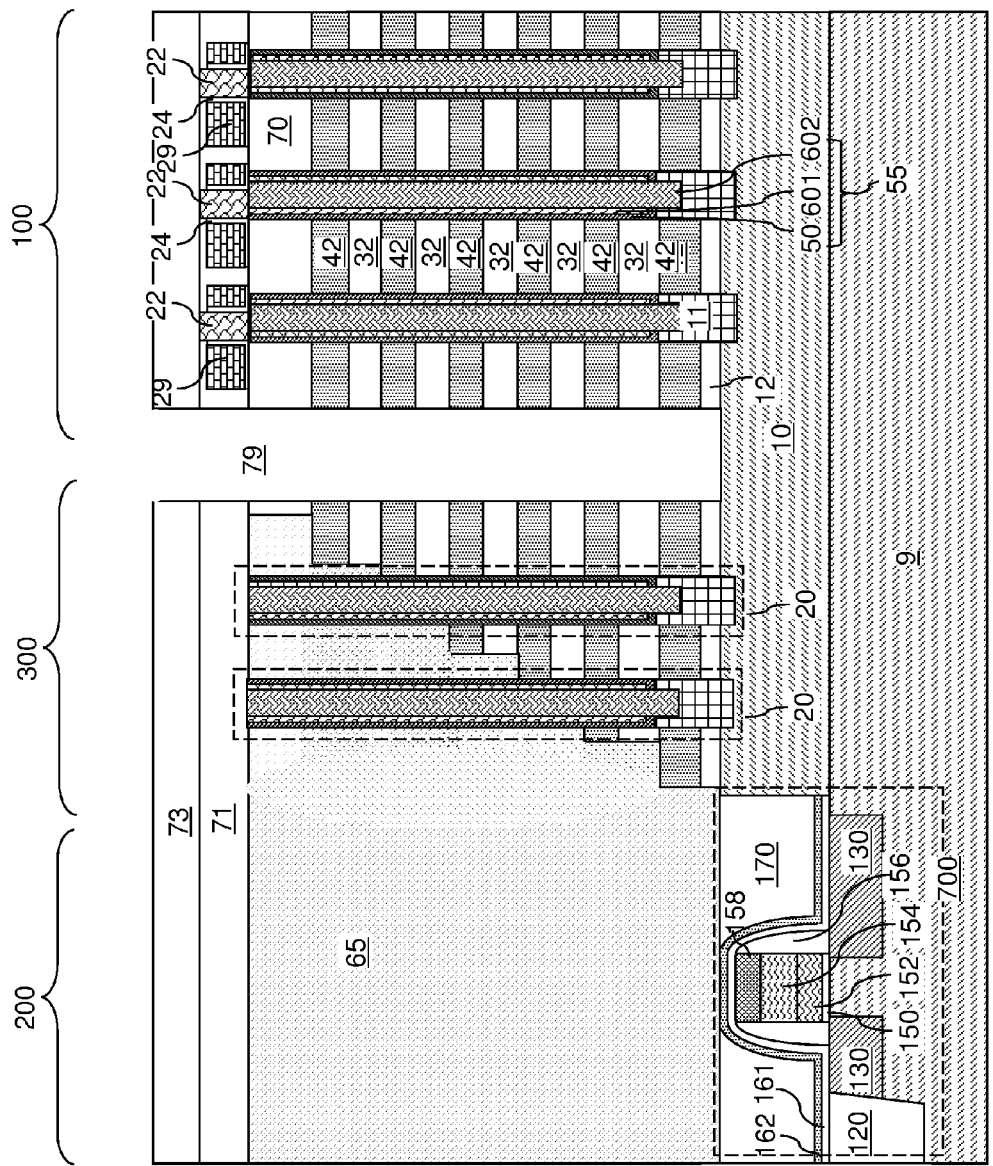
FIG. 13A is a vertical cross-sectional view of the exemplary structure after formation of backside trenches according to an embodiment of the present disclosure.
Figure 13B:
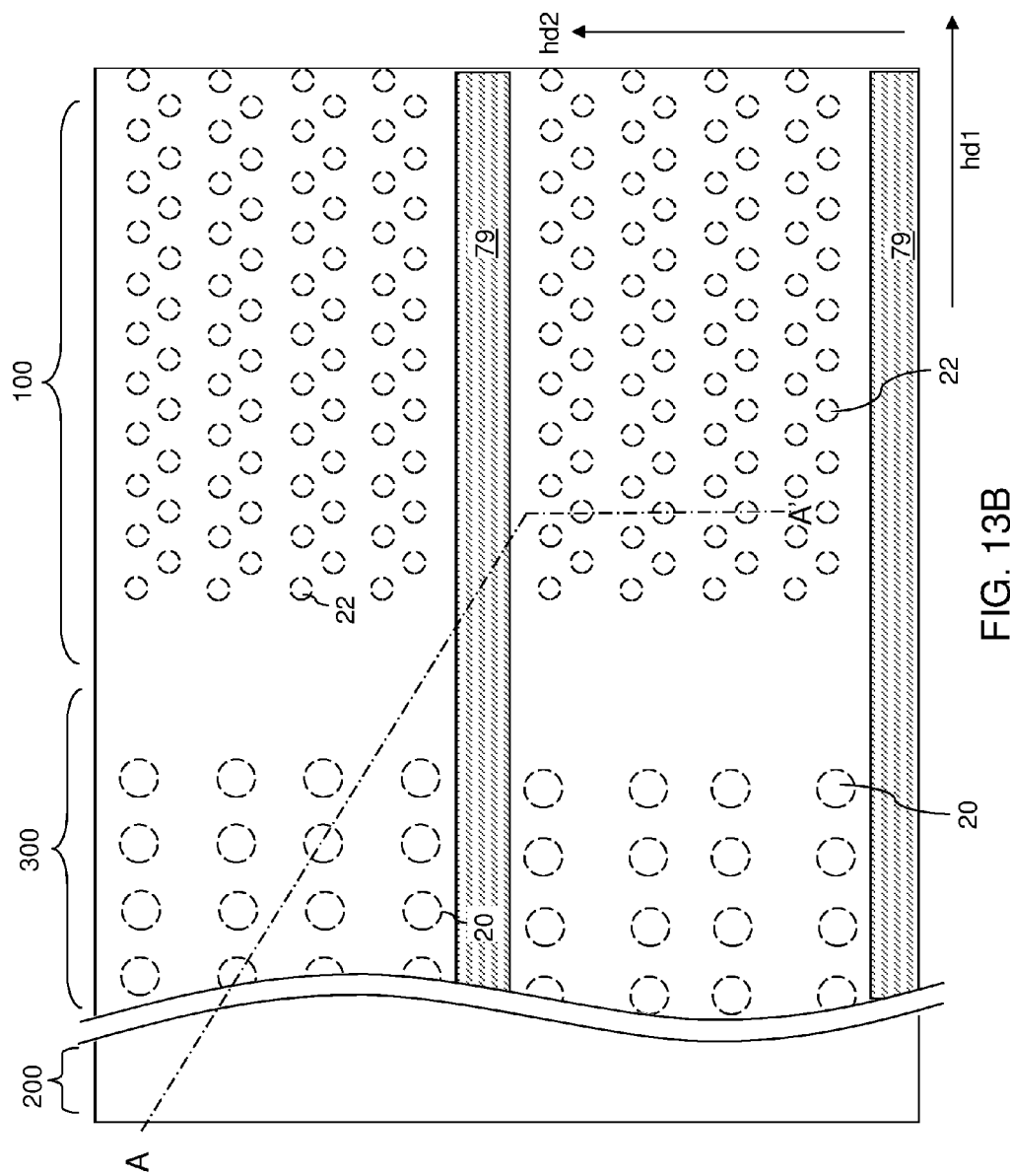
FIG. 13B is a top-down view of the exemplary structure of FIG. 13A. The vertical plane A-A' is the plane of the schematic vertical cross-sectional view of FIG. 13A.

Referring to FIGS. 13A and 13B, a photoresist layer (not shown) can be applied over the drain level dielectric material layer 73, and is lithographically patterned to form openings in areas between clusters of memory stack structures 55. The pattern in the photoresist layer can be transferred through the drain level dielectric material layer 73, the drain select level dielectric layer 71, the alternating stack (32, 42), and/or the retro-stepped dielectric material portion 65 employing an anisotropic etch to form backside trenches 79. The backside trenches 79 vertically extend at least to the top surface of the substrate (9, 10), and laterally extend through the memory array region 100 and the contact region 300. In one embodiment, the backside trenches 79 can be employed as source contact openings in which source contact via structures can be subsequently formed. In one embodiment, the backside trenches 79 can laterally extend along the first horizontal direction hd1, i.e., along the word line direction of the rows of the drain select level channel portions 22. The photoresist layer can be removed, for example, by ashing.

Figure 14:
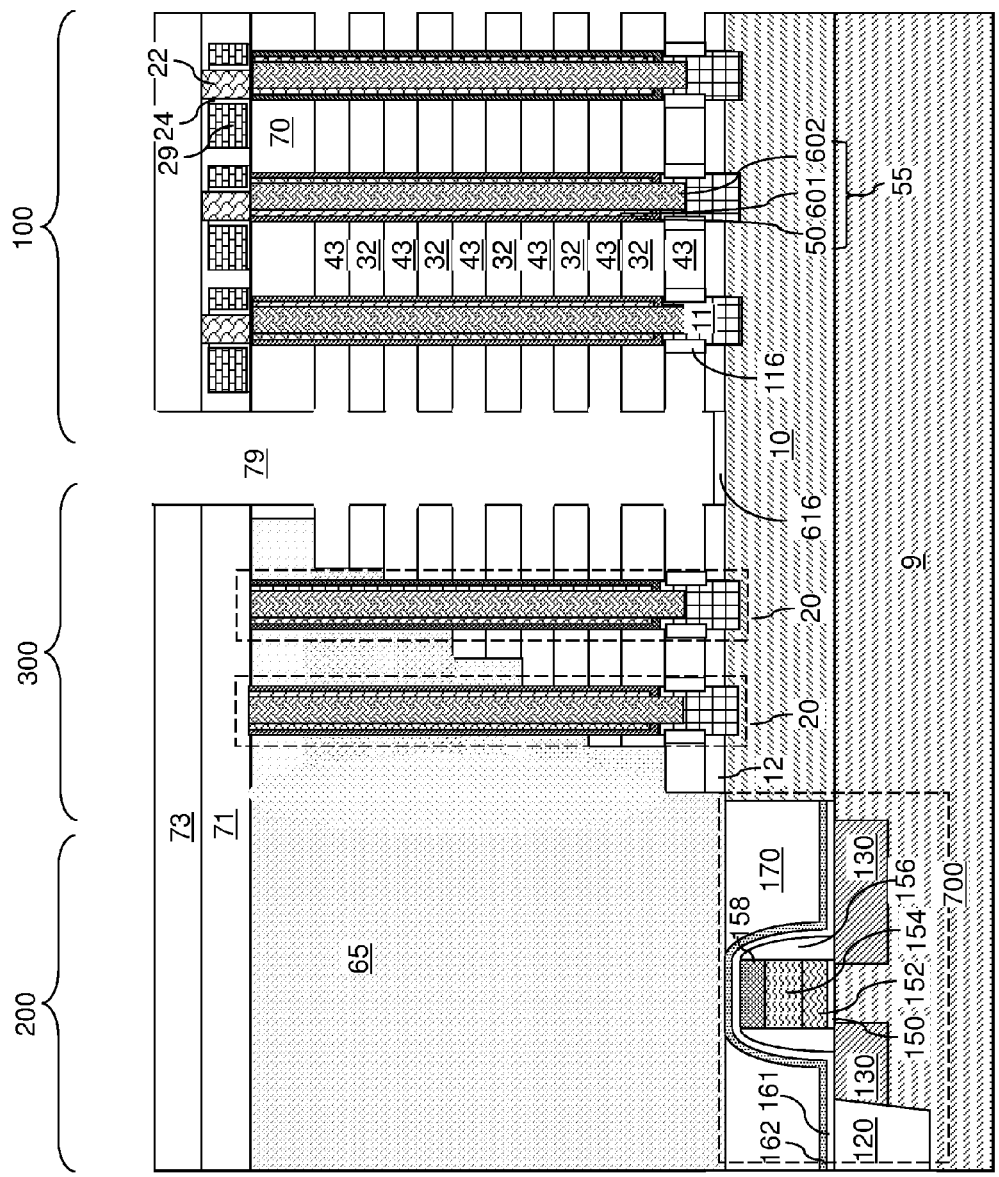
FIG. 14 is a vertical cross-sectional view of the exemplary structure after formation of backside recesses by removal of the sacrificial material layers with respect to the insulating layers according to an embodiment of the present disclosure.

Referring to FIG. 14, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the support pillar structure 20, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32 and the retro-stepped dielectric material portion 65 can be selected from silicon oxide, silicon nitride, and dielectric metal oxides. In this case, the depth of the backside trenches 79 can be modified so that the bottommost surface of the backside trenches 79 is located within the gate dielectric layer 12, i.e., to avoid physical exposure of the top surface of the semiconductor material layer 10.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 15:
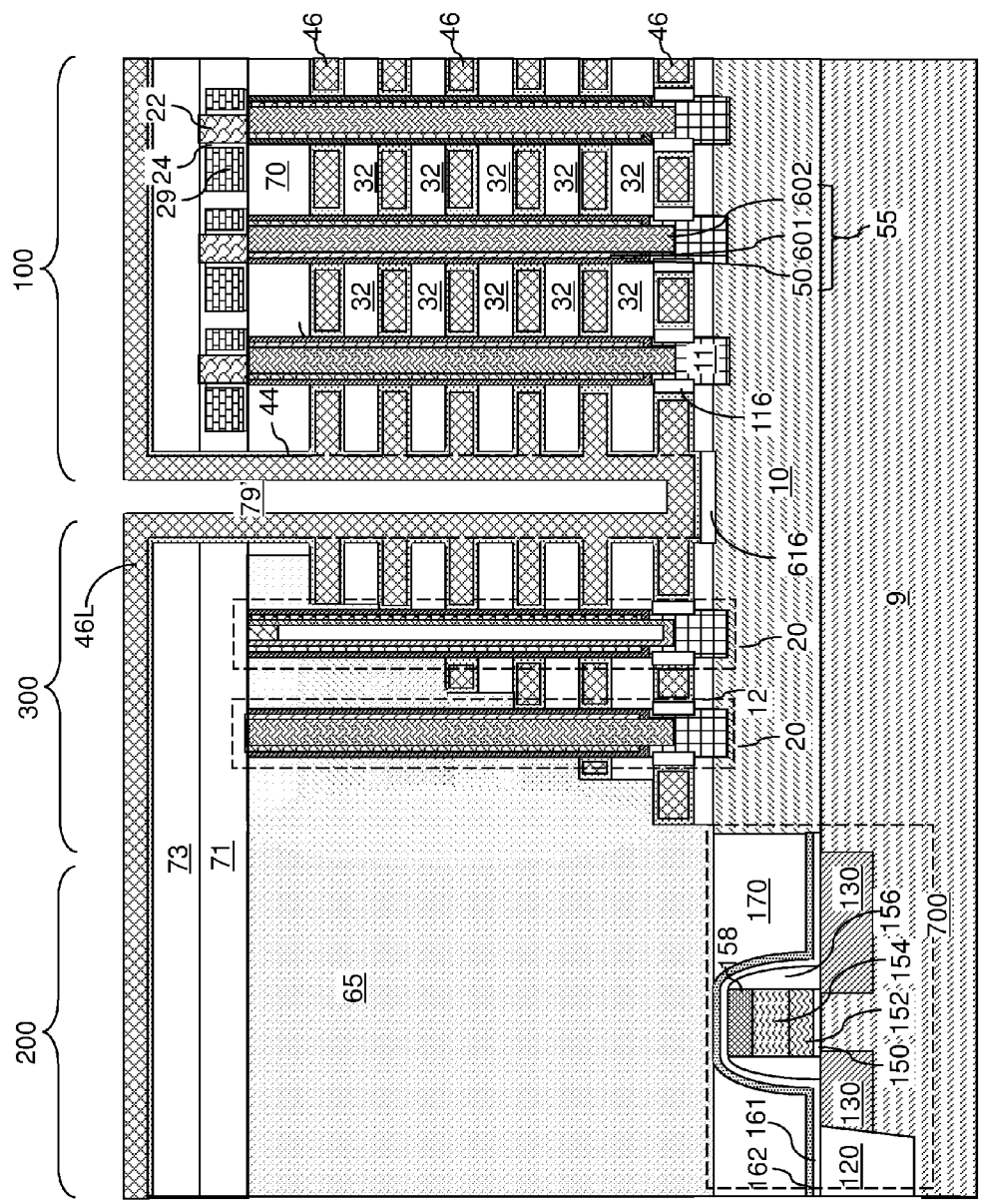
FIG. 15 is a vertical cross-sectional view of the exemplary structure after formation of an optional backside blocking dielectric layer and at least one conductive material in the backside recesses and peripheral portions of the backside trenches according to an embodiment of the present disclosure.

Referring to FIG. 15, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. The backside blocking dielectric layer is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer.

At least one conductive material can be deposited in the backside recesses 43, peripheral portions of the backside trenches 79, and over the drain level dielectric material layer 73 by conformal deposition. Each continuous portion of the at least one conductive material deposited in a backside recess 43 constitutes an electrically conductive layer 46. The conductive material deposited outside of the backside recesses 43 collectively constitute a continuous metallic material layer 46L, which is a continuous layer of the conductive material that is deposited over the drain level dielectric material layer 73 and at peripheral portions of the backside trenches 79.

In an illustrative example, a metallic barrier layer (not explicitly shown) can be deposited in the backside recesses. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in the plurality of backside recesses 43, on the sidewalls of the at least one the backside contact trench 79, and over the top surface of the drain level dielectric material layer 73 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 can be formed in the plurality of backside recesses 43. The continuous metallic material layer 46L can be formed on the sidewalls of each backside contact trench 79 and over the drain level dielectric material layer 73. Each electrically conductive layer 46 includes a portion of the metallic barrier layer and a portion of the metallic fill material layer that are located between a vertically neighboring pair of dielectric material layers, which can be a pair of insulating layers 32, a bottommost insulating layer and a gate dielectric layer 12, or a topmost insulating layer and the insulating cap layer 70. The continuous metallic material layer 46L includes a continuous portion of the metallic barrier layer and a continuous portion of the metallic fill material layer that are located in the backside trenches 79 or above the drain level dielectric material layer 73.

Each sacrificial material layer 42 can be replaced with an electrically conductive layer 46. A backside cavity 79' is present in the portion of each backside contact trench 79 that is not filled with the backside blocking dielectric layer and the continuous metallic material layer 46L. A tubular dielectric spacer 116 laterally surrounds an epitaxial channel portion 11. A bottommost electrically conductive layer 46 laterally surrounds each tubular dielectric spacer 116 upon formation of the electrically conductive layers 46.

Figure 16:
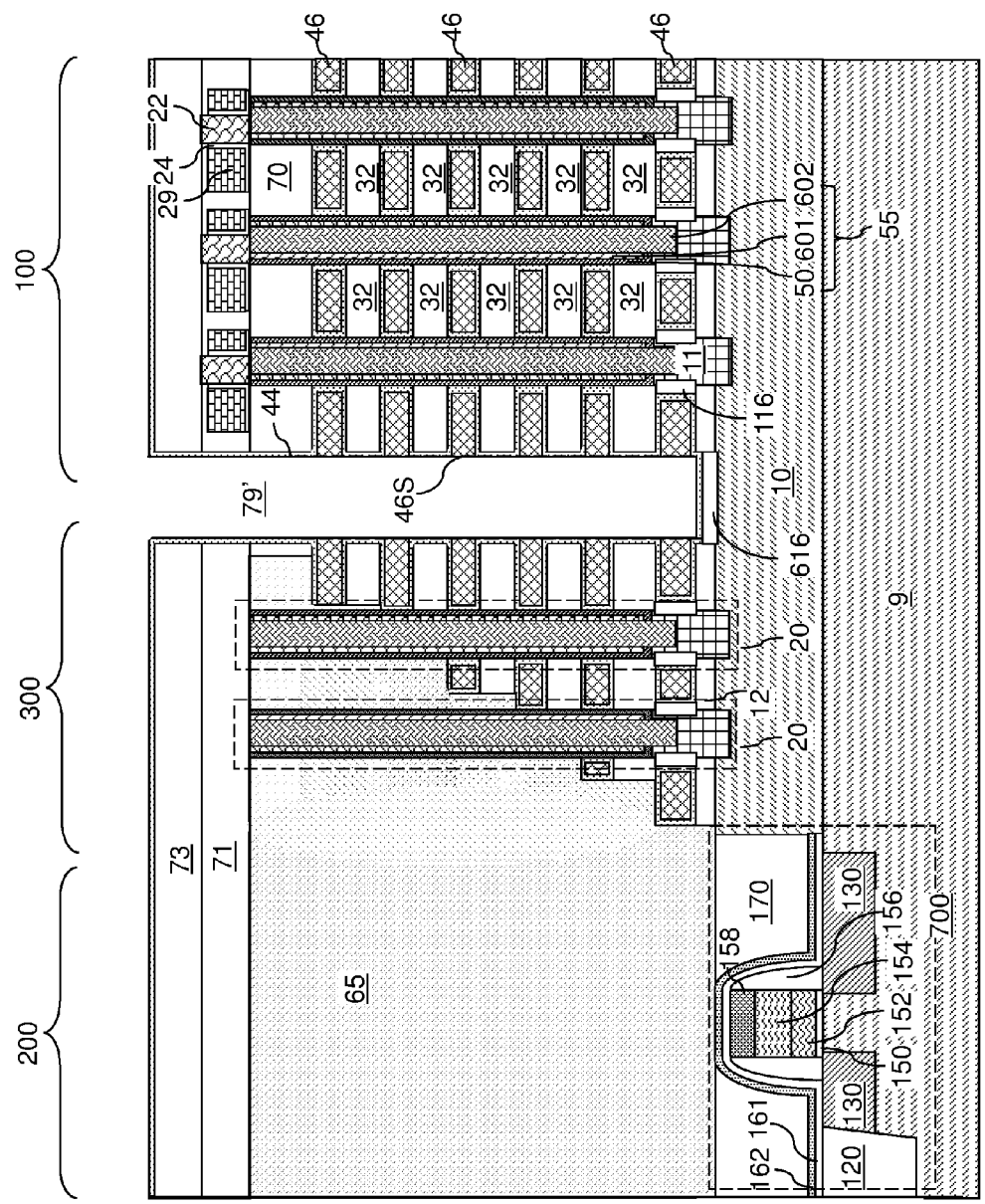
FIG. 16 is a vertical cross-sectional view of the exemplary structure after removal of a deposited conductive material from within the backside trenches according to an embodiment of the present disclosure.

Referring to FIG. 16, the deposited metallic material of the continuous electrically conductive material layer 46L is etched back from the sidewalls of each backside contact trench 79 and from above the drain level dielectric material layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each drain select level gate electrode 29 functions as a drain side select gate electrode (SGD) of the vertical NAND string. One or several of the bottommost electrically conductive layers functions as a source side select gate electrode (SGS) of the vertical NAND string. Each electrically conductive layer 46 located between the drain side and the source side select gate electrodes can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside contact trench 79. The gate dielectric layer 12 can be vertically spaced from the backside contact trench 79 by the horizontal portion of the backside blocking dielectric layer 44.

In another embodiment, the removal of the continuous electrically conductive material layer 46L may not be selective to the material of the backside blocking dielectric layer 44 or, the backside blocking dielectric layer 44 may not be employed. In this case, a top surface and/or sidewall surface, of the gate dielectric layer 12 can be physically exposed at the bottom of the backside contact trench 79 depending on whether the gate dielectric layer 12 is not removed or partially removed during removal of the continuous electrically conductive material layer 46L. A backside cavity 79' is present within each backside contact trench 79.

Figure 17:
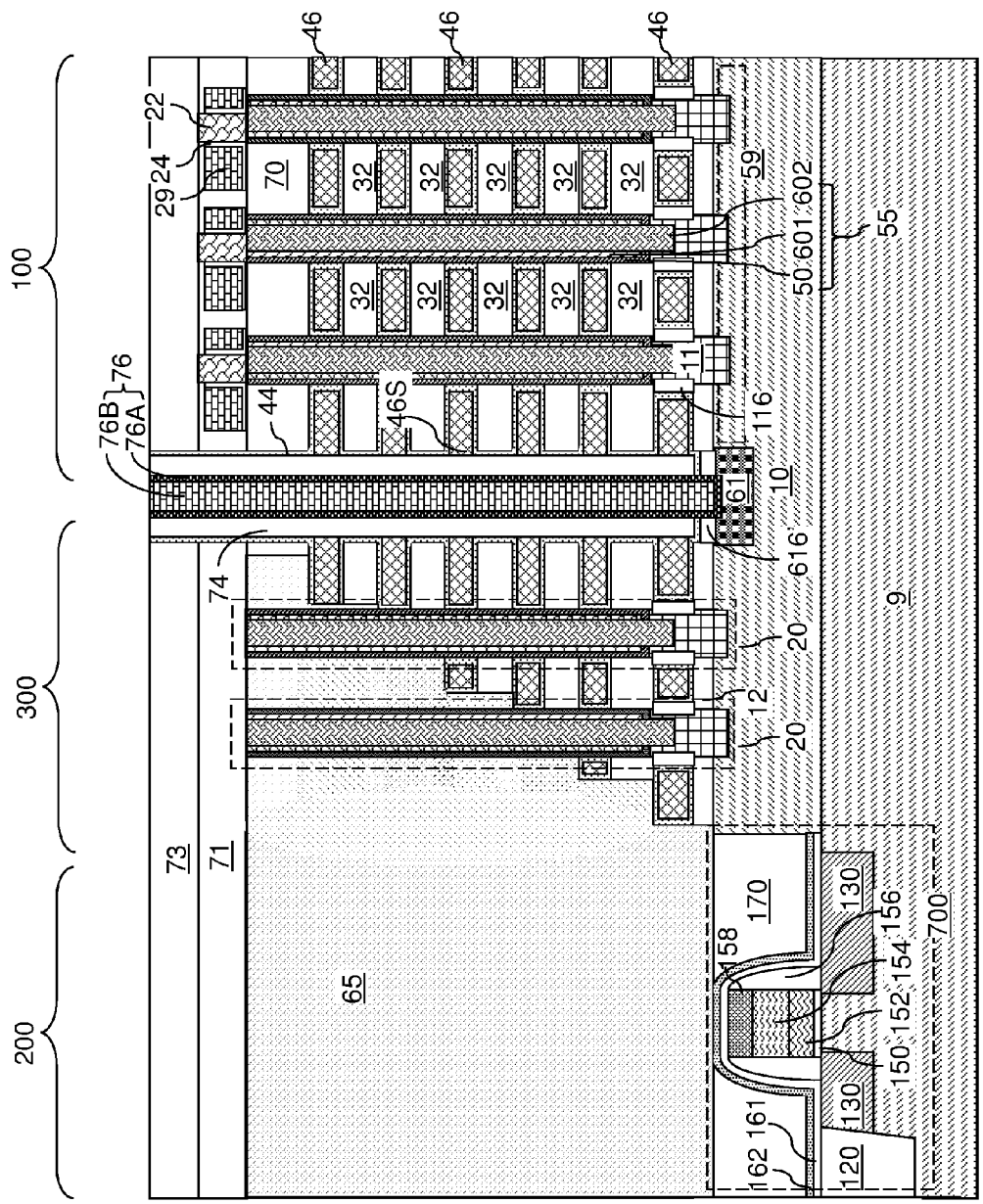
FIG. 17 is a schematic vertical cross-sectional view of the exemplary structure after formation of an insulating spacer and a backside contact structure within each backside trench according to an embodiment of the present disclosure.

Referring to FIG. 17, an insulating material layer can be formed in the at least one backside contact trench 79 and over the drain level dielectric material layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the drain level dielectric material layer 73 and at the bottom of each backside contact trench 79. Each remaining portion of the insulating material layer constitutes an insulating spacer 74. A backside cavity 79' is present within a volume surrounded by each insulating spacer 74.

The anisotropic etch process can continue with, or without, a change in the etch chemistry to remove portions of the optional backside blocking dielectric layer 44 and the planar dielectric portion 616 that underlies the opening through the insulating spacer 74. An opening is formed though the planar dielectric portion 616 underneath each backside cavity 79', thereby vertically extending the backside cavity 79'. A top surface of the semiconductor material layer 10 can be physically exposed at the bottom of each backside contact trench 79. The remaining portion of each planar dielectric portion 616 is herein referred to as an annular dielectric portion 616', which can include a dielectric oxide of the semiconductor material of the semiconductor material layer 10, have a uniform thickness, and an opening therethrough.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74. Each source region 61 can have a doping of a second conductivity type, which is the opposite of the first conductivity type. For example, if the first conductivity type is p-type, the second conductivity type is n-type, and vice versa.

An upper portion of the semiconductor material layer 10 that extends between the source region 61 and the plurality of epitaxial channel portions 11 constitutes a horizontal semiconductor channel 59 for a plurality of field effect transistors. The horizontal semiconductor channel 59 is connected to multiple vertical semiconductor channels 60 through respective epitaxial channel portions 11. The horizontal semiconductor channel 59 contacts the source region 61 and the plurality of epitaxial channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10).

A contact via structure 76 can be formed within each cavity 79'. Each contact via structure 76 can fill a respective cavity 79'. The contact via structures 76 can be formed by depositing at least one conductive material in the remaining unfilled volume (i.e., the backside cavity 79') of the backside contact trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the drain level dielectric material layer 73 overlying the alternating stack (32, 46) as a stopping layer. If chemical mechanical planarization (CMP) process is employed, the drain level dielectric material layer 73 can be employed as a CMP stopping layer. Each remaining continuous portion of the at least one conductive material in the backside contact trenches 79 constitutes a backside contact via structure 76. The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

In the prior embodiment, the drain select level gate electrodes 29 are formed prior to forming the electrically conductive layers (e.g., word lines) 46 and prior to forming the backside contact via structure 76. In one alternative embodiment, the steps described above for forming the drain select level gate electrodes 29 can be performed after forming the electrically conductive layers (e.g., word lines) 46 and prior to forming the backside contact via structure 76. In another alternative embodiment, the steps described above for forming the drain select level gate electrodes 29 can be performed after forming the electrically conductive layers (e.g., word lines) 46 and after forming the backside contact via structure 76.

Figure 18:
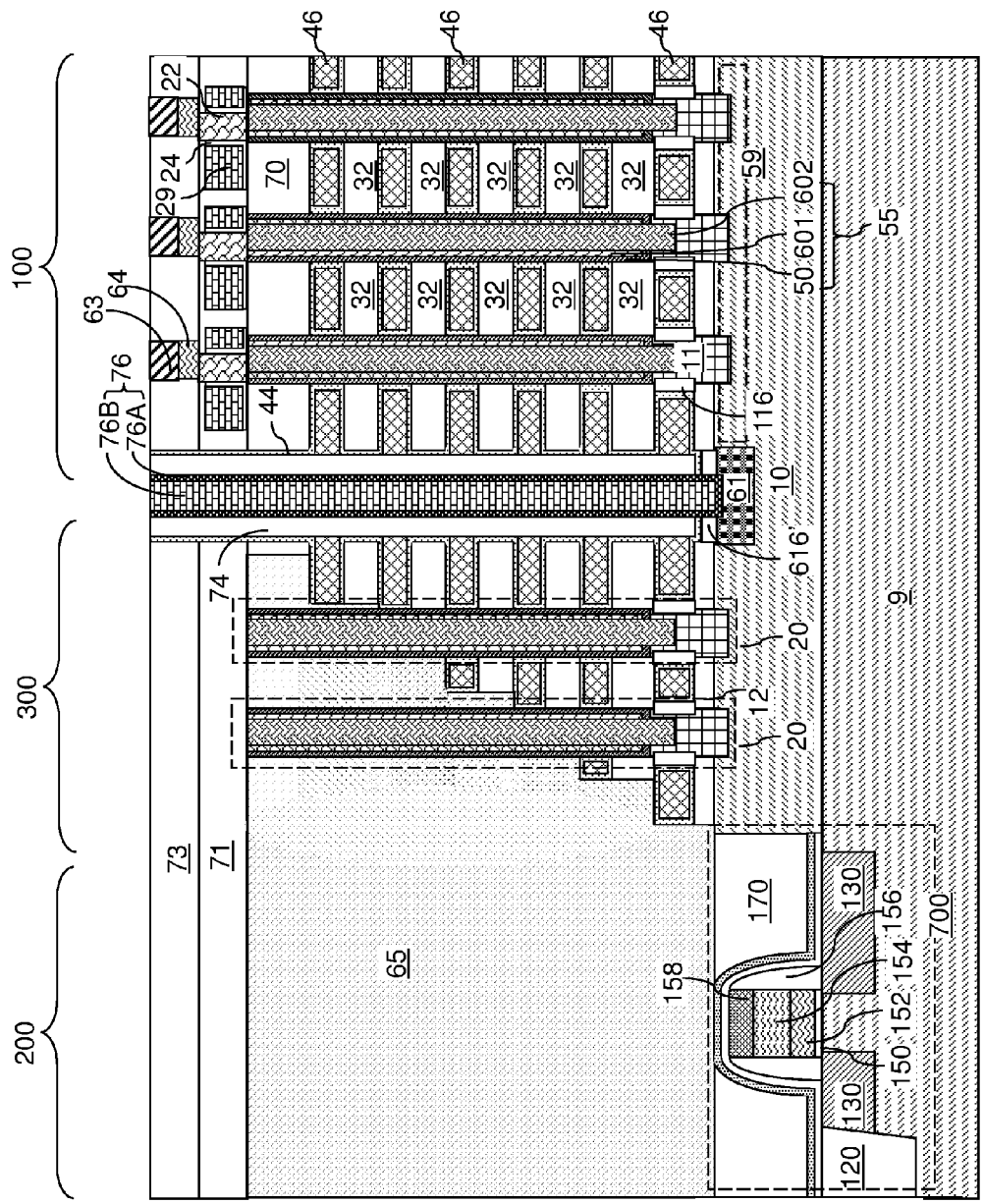
FIG. 18 is a schematic vertical cross-sectional view of the exemplary structure after formation of drain regions according to an embodiment of the present disclosure.

Referring to FIG. 18, via cavities are formed through the drain level dielectric material layer 73. For example, a photoresist layer (not shown) can be applied over the drain level dielectric material layer 73, and can be lithographically patterned to form openings in areas that overlie the memory stack structures 55. An anisotropic etch can be performed to transfer the pattern of the photoresist layer through the drain level dielectric material layer 73, thereby forming the via cavities. The photoresist layer can be subsequently removed, for example, by ashing.

In one embodiment, semiconductor material can be deposited in the via cavities, for example, by a conformal semiconductor material deposition process such as low pressure chemical vapor deposition (LPCVD). Excess portions of the deposited semiconductor material can be removed from above the horizontal plane including the top surface of the drain level dielectric material layer 73 by a planarization process, which can employ chemical mechanical planarization (CMP) and/or a recess etch. A semiconductor material portion is formed within each via cavity through the drain level dielectric material layer 73. In one embodiment, the semiconductor material can have a doping of the first conductivity type, or can be intrinsic. In this case, dopants of the second conductivity type can be implanted into at least the upper portion of each semiconductor material portion to form drain regions 63, which has a doping of the second conductivity type. The source regions 61 and the drain regions 63 can have a doping of the second conductivity type at a dopant concentration in a range from $1.0 \times 10^{19}/cm^3$ to $2.0 \times 10^{20}/cm^3$, although lesser and greater dopant concentrations can also be employed.

In another embodiment, the drain regions 63 can be formed by ion implanting dopants of the second conductivity type (e.g., n-type dopants, such as P or As) in the drain select level channel portions 22 to convert at least an upper portion of each drain select level channel portion 22 to a drain region 63. In alternative embodiments, the drain regions 63 can be formed prior to forming the electrically conductive layers (e.g., word lines) 46 or prior to forming the backside contact via structure 76.

In one embodiment, the drain regions 63 can extend to the horizontal plane including the top surfaces of the drain select level channel portions 22. In this case, the drain regions 63 can physically contact top surfaces of the drain select level channel portions 22. Alternatively, the bottom surface of the drain regions 63 may be located above the horizontal plane including the top surfaces of the drain select level channel portions 22. In this case, remaining portions of the semiconductor material portions that have a doping of the first conductivity type or intrinsic constitute a top semiconductor channel portion 64.

Semiconductor channels (59, 11, 60, 22, 64) are formed between each drain region 63 and a respective source region 61 that is proximal to the array of memory stack structures 55 underlying the drain regions 63. Each semiconductor channel (59, 11, 60, 64) includes a horizontal semiconductor channel 59, an optional epitaxial channel portion 11 (if present), a vertical semiconductor channel (60, 22 and optionally 64). Each vertical semiconductor channel (60, 22, 64) includes a memory level channel portion 60, a drain select level channel portion 22, and an optional top semiconductor channel portion 64.

Each of the various components of a semiconductor channel (59, 11, 60, 64) can have an independent semiconductor composition that may, or may not, be the same as semiconductor composition(s) of other components of the semiconductor channel (59, 11, 60, 64). Further, each of the various components of a semiconductor channel (59, 11, 60, 64) can be p-doped or intrinsic. The dopant concentration of each of the various components of a semiconductor channel (59, 11, 60, 64) can be independently controlled for optimal performance. As such, the dopant concentration of each of the various components of a semiconductor channel (59, 11, 60, 64) may, or may not, be the same as dopant concentrations of other components of the various components of a semiconductor channel (59, 11, 60, 64).

The drain regions 63 are embedded in the drain level dielectric material layer 73, and can be located over the drain select level gate electrodes 29. In one embodiment, each of the drain regions 63 can contact a top end of a respective vertical semiconductor channel (60, 22, 64) including a respective one of the drain select level channel portions 22 and a respective one of the memory level channel portions 60, and optionally including a top semiconductor channel portion 64. In one embodiment, each drain region 63 can have a respective geometrical center that is located on the same vertical axis as the geometrical center of the respective one of the memory level channel portions 60 that underlies the drain region 63. In other words, the drain regions 63 can be formed as a periodic two-dimensional array located at areas that coincide with the areas of the periodic two-dimensional array of memory stack structures 55. Alternatively, the drain regions 63 can be formed as a periodic two-dimensional array located at areas that coincide with the drain select level channel portions 22, such as when the drain regions 63 are formed by ion implantation into the drain select level channel portions 22.

Figure 19A:
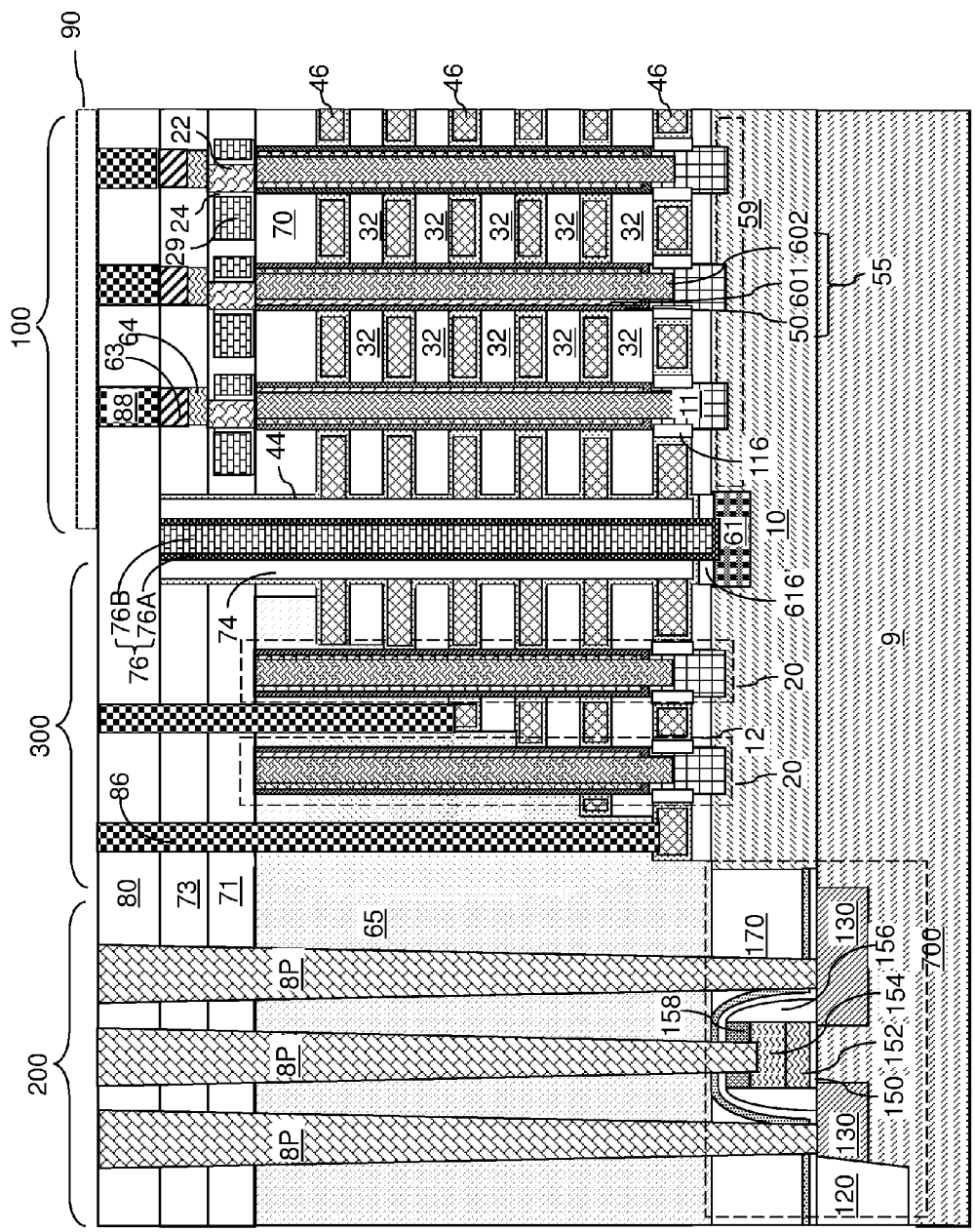
FIG. 19A is a schematic vertical cross-sectional view of the exemplary structure after formation of additional contact via structures according to an embodiment of the present disclosure.

Referring to FIGS. 19A and 19B, a contact level dielectric material layer 80 can be formed over the drain level dielectric material layer 73. The contact level dielectric material layer 80 includes a dielectric material such as silicon oxide, silicon nitride, and/or organosilicate glass.

Additional contact via structures (88, 86, 8P) can be formed through the contact level dielectric layer 80, the drain level dielectric material layer 73, the drain select level dielectric layer 71, and optionally through the retro-stepped dielectric material portion 65. For example, drain contact via structures 88 can be formed through the contact level dielectric material layer 80 on each drain region 63. Bit lines 90 which extend in the second horizontal direction (i.e., hd2)

can be formed in electrical contact with the drain contact via structures 88. Word line contact via structures 86 can be formed on the electrically conductive layers 46 through the contact level dielectric layer 80, the drain level dielectric material layer 73, the drain select level dielectric layer 71, and through the retro-stepped dielectric material portion 65. Peripheral device contact via structures 8P can be formed through the contact level dielectric layer 80, the drain level dielectric material layer 73, the drain select level dielectric layer 71, and through the retro-stepped dielectric material portion 65 directly on respective nodes of the peripheral devices.

The exemplary structure of the present disclosure includes a three-dimensional memory device, which comprises: an alternating stack of insulating layers 32 and electrically conductive layers 46 located over a substrate (9, 10), memory stack structures 55 extending through the alternating stack (32, 46), wherein each of the memory stack structures 55 comprises a memory film 50 and a memory level channel portion 60 contacting an inner sidewall of the memory film 50, and drain select level channel portions 22 overlying a respective memory level channel portion 60. In one embodiment, a geometrical center of each drain select level channel portion 22 is laterally offset with respect to a geometrical center of the respective memory level channel portion 60. Drain select level gate dielectrics 24 laterally surround and contact a respective subset of the drain select level channel portions 22. Drain select level gate electrodes 29 laterally surround respective drain select level gate dielectrics 24. In one embodiment, the drain select level gate electrodes comprise convex outer sidewalls.

In one embodiment, the memory stack structures 55 are arranged as a two-dimensional periodic array including respective rows that extend along a first horizontal direction hd1 and have a uniform inter-row pitch p along a second horizontal direction hd2; and the drain select level channel portions 22 are arranged in respective rows that extend along the first horizontal direction hd1 and have a periodically modulated inter-row center-to-center spacing (ICS1, ICS2) having a periodicity of twice the inter-row pitch p of the two-dimensional periodic array of the memory stack structures 55.

Adjacent rows that belong to two different neighboring pairs of rows PRR have a second inter-row center-to-center spacing ICS2 that is greater than the inter-row pitch, p, of the two-dimensional periodic array of the memory stack structures 55, and greater than the first inter-row center-to-center spacing ICS1.

The drain select level gate electrodes 29 have a continuous set of sidewalls that laterally surround a respective pair of rows PRR of drain select level channel portions 22, as shown in FIG. 10B.

The drain select level gate electrodes 29 are physically adjoined in each pair of rows PRR, but are physically disjoined among one another between each pair of rows PRR, as shown in FIG. 10B.

The continuous set of sidewalls of the drain select level gate electrodes 29 comprise convex outer sidewalls 29A that partially laterally surround the respective drain select level channel portion 22 in the pair of rows PRR of drain select level channel portions 22 and planar, non-convex outer sidewalls 29B that surround an elongated template structure 122. The convex outer sidewalls 29A are separated by concave outer sidewall portions 29C as shown in FIG. 10B. In contrast, the electrically conductive layers (i.e., word lines) 46 have planar, non-convex outer sidewalls 46S which abut the planar sidewall of the dielectric spacer 74 in the backside trench 79 containing the contact via structure 76, as shown in FIGS. 16 and 17. As used herein, "outer" sidewalls are the sidewalls which face away from the respective semiconductor channel portions (22, 60).

In one embodiment, the drain select level channel portions 22 are arranged as pairs of rows PRR that extend along the first horizontal direction hd1; and two rows with each pair of rows PRR has a first inter-row center-to-center spacing ICS1 that is less than the inter-row pitch p of the two-dimensional periodic array of the memory stack structures 55. In one embodiment, the drain select level gate electrodes 29 are physically disjoined among one another between each pairs of rows PRR. Each drain select level channel portion 22 within a pair of rows PRR of the drain select level channel portions 22 is laterally surrounded by a respective one of the drain select level gate electrodes 29.

In one embodiment, the drain select level gate dielectrics 24 are physically disjoined among one another between each part of rows PRR. Each drain select level channel portion 22 within a pair of rows PRR of the drain select level channel portions 22 is laterally surrounded by, and contacts, a respective one of the drain select level gate dielectrics 24. In one embodiment, each drain select level gate dielectric 24 includes vertical portions that contact a sidewall of a respective drain select level channel portion 22 and a horizontal portion that is adjoined to a bottom periphery of each one of the vertical portions of the drain select level gate dielectric 24.

In one embodiment, each geometrical center of the drain select level channel portions 22 is laterally offset from a geometrical center of a respective underlying memory level channel portion 60 along the second horizontal direction hd2, and not along the first horizontal direction hd1. In one embodiment, each of the drain select level gate dielectrics 24 is in physical contact with a top surface of the respective underlying memory level channel portion 60. The three-dimensional memory device can further comprise drain regions 63 each contacting a top end of a respective drain select level channel portions 22.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46). The terrace region includes stepped surfaces of the alternating stack (32, 46) that continuously extend from a bottommost layer within the alternating stack (32, 46) to a topmost layer within the alternating stack (32, 46). Support pillar structures 20 extend through the stepped surfaces and through a retro-stepped dielectric material portion 65 that overlies the stepped surfaces.

The exemplary structure can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60, 22, 64), wherein at least one end portion (60, 22, 64) of each of the plurality of semiconductor channels (59, 11, 60, 22, 64) extends substantially perpendicular to a top surface of the substrate (9, 10); and a plurality of charge storage elements (as embodied as charge trapping material portions). Each charge storage element can be located adjacent to a respective one of the plurality of semiconductor channels (59, 11, 60, 22, 64).

One embodiment of the present disclosure provides a simpler method of making the drain side select gate (SGD) device using a single masking step for the SGD device patterning and isolation, and simple process steps to realize 2-staggered SGD device isolation. The 2-staggered SGD device is formed on top of the three dimensional NAND memory array by formation of channel posts 22 and self-aligned select gate electrode 29 isolation without requiring a dedicated space. The shallow trench isolation process which separates drain side select gate electrodes between memory blocks in the prior art processes can be omitted due to self aligned separation of the drain sided select gate electrode 29.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and electrically conductive layers located over a substrate;
memory stack structures extending through the alternating stack, wherein each of the memory stack structures comprises a memory film and a memory level channel portion contacting an inner sidewall of the memory film;
drain select level channel portions overlying a respective memory level channel portion, wherein a geometrical center of each drain select level channel portion is laterally offset with respect to a geometrical center of the respective memory level channel portion;
drain select level gate dielectrics laterally surrounding and contacting a respective subset of the drain select level channel portions; and
drain select level gate electrodes laterally surrounding respective drain select level gate dielectrics;
wherein:
the memory stack structures are arranged as a two-dimensional periodic array including respective rows that extend along a first horizontal direction and have a uniform inter-row pitch along a second horizontal direction;
the drain select level channel portions are arranged in respective rows that extend along the first horizontal direction and have a periodically modulated inter-row center-to-center spacing having a periodicity of twice the inter-row pitch of the two-dimensional periodic array of the memory stack structures;
the drain select level channel portions are arranged as pairs of rows that extend along the first horizontal direction;
two rows within each pair of rows has a first inter-row center-to-center spacing that is less than the inter-row pitch of the two-dimensional periodic array of the memory stack structures;
adjacent rows that belong to two different neighboring pairs of rows have a second inter-row center-to-center spacing that is greater than the inter-row pitch of the two-dimensional periodic array of the memory stack structures, and greater than the first inter-row center-to-center spacing;
the drain select level gate electrode has a continuous set of sidewalls that laterally surrounds a respective pair of rows of drain select level channel portions;
the drain select level gate electrodes are physically adjoined in each pair of rows, but are physically disjoined among one another between each pair of rows;
each drain select level channel portion within the pair of rows of the drain select level channel portions is laterally surrounded by a respective one of the drain select level gate electrodes;
the continuous set of sidewalls of the drain select level gate electrode comprises convex outer sidewalls that partially laterally surround the respective drain select level channel portion in the pair of rows, and planar, non-convex outer sidewalls that surround an elongated template structure; and
the electrically conductive layers have planar, non-convex outer sidewalls.

2. A method of forming a three-dimensional memory device, comprising:
forming an alternating stack of insulating layers and spacer material layers over a substrate, wherein the spacer material layers are formed as, or replaced with, electrically conductive layers;
forming memory stack structures through the alternating stack, wherein each of the memory stack structures comprises a memory film and a memory level channel portion contacting an inner sidewall of the memory film;
forming drain select level channel portions over the memory level channel portions after the step of forming the memory stack structures,
forming drain select level gate dielectrics on and around the drain select level channel portions; and
forming drain select level gate electrodes around the drain select level gate dielectrics;
wherein:

a geometrical center of each drain select level channel portion is laterally offset with respect to a geometrical center of a respective underlying memory level channel portion;

the memory stack structures are formed as a two-dimensional periodic array including respective rows that extend along a first horizontal direction and have a uniform inter-row pitch along a second horizontal direction;

the drain select level channel portions are arranged in respective rows that extend along the first horizontal direction and have a periodically modulated inter-row center-to-center spacing having a periodicity of twice the inter-row pitch of the two-dimensional periodic array of the memory stack structures;

the drain select level channel portions are arranged as pairs of rows that extend along the first horizontal direction;

two rows within each pair of rows has a first inter-row center-to-center spacing that is less than the inter-row pitch of the two-dimensional periodic array of the memory stack structures; and adjacent rows that belong to two different neighboring pairs of rows have a second inter-row center-to-center spacing that is greater than the inter-row pitch of the two-dimensional periodic array of the memory stack structures, and greater than the first inter-row center-to-center spacing;

further comprising:

forming a stack of a drain select level gate dielectric layer and a drain select level gate electrode layer over the drain select channel portions; and removing horizontal portions of the stack of the drain select level gate dielectric layer and the drain select level gate electrode layer, wherein remaining portions of the drain select level gate dielectric layer constitute the drain select level gate dielectrics and remaining portions of the drain select level gate electrode layer constitute the drain select level gate electrodes;

wherein:

the drain select level gate electrode has a continuous set of sidewalls that laterally surround a respective pair of rows of drain select level channel portions;

the drain select level gate electrodes are physically adjoined in each pair of rows, but are physically disjoined among one another between each pair of rows;

the continuous set of sidewalls of the drain select level gate electrode comprises convex outer sidewalls that that partially laterally surround the respective drain select level channel portion in the pair of rows and planar, non-convex outer sidewalls that surround an elongated template structure;

the electrically conductive layers have planar, non-convex outer sidewalls;

the drain select level gate dielectrics are physically disjoined among one another between each pair of rows; and each drain select level gate dielectric laterally surrounds, and contacts, a respective subset of the drain select level channel portions that are arranged as the pair of rows that laterally extend along a first horizontal direction.

3. A three-dimensional memory device comprising:

an alternating stack of insulating layers and electrically conductive layers located over a substrate;

memory stack structures extending through the alternating stack, wherein each of the memory stack structures comprises a memory film and a memory level channel portion contacting an inner sidewall of the memory film;

drain select level channel portions overlying a respective memory level channel portion;

drain select level gate dielectrics laterally surrounding and contacting a respective subset of the drain select level channel portions; and drain select level gate electrodes laterally surrounding respective drain select level gate dielectrics, wherein the drain select level gate electrodes comprise convex outer sidewalls;

wherein:

the memory stack structures are arranged as a two-dimensional periodic array including respective rows that extend along a first horizontal direction and have a uniform inter-row pitch along a second horizontal direction;

the drain select level channel portions are arranged in respective rows that extend along the first horizontal direction and have a periodically modulated inter-row center-to-center spacing;

the drain select level channel portions are arranged as pairs of rows that extend along the first horizontal direction;

two rows within each pair of rows has a first inter-row center-to-center spacing that is less than the inter-row pitch of the two-dimensional periodic array of the memory stack structures;

adjacent rows that belong to two different neighboring pairs of rows have a second inter-row center-to-center spacing that is greater than the inter-row pitch of the two-dimensional periodic array of the memory stack structures, and greater than the first inter-row center-to-center spacing;

the drain select level gate electrode comprises a continuous set of the sidewalls that laterally surround a respective pair of rows of drain select level channel portions;

the drain select level gate electrodes are physically adjoined in each pair of rows, but are physically disjoined among one another between each pair of rows;

each drain select level channel portion within the pair of rows of the drain select level channel portions is laterally surrounded by a respective one of the drain select level gate electrodes;

the continuous set of sidewalls of the drain select level gate electrode comprises the convex outer sidewalls that that partially laterally surround the respective drain select level channel portion in the pair of rows and planar, non-convex outer sidewalls that surround an elongated template structure; and the electrically conductive layers have planar, non-convex outer sidewalls.

* * * * *